(12) United States Patent
Rudolph

(10) Patent No.: US 9,960,009 B2
(45) Date of Patent: May 1, 2018

(54) METHODS AND SYSTEMS FOR DETERMINING A FAULT IN A GAS HEATER CHANNEL

(71) Applicant: Lam Research Corporation, Fremont, CA (US)

(72) Inventor: Dirk Rudolph, Dundee, OR (US)

(73) Assignee: Lam Research Corporation, Fremont, CA (US)

( * ) Notice: Subject to any disclaimer, the term of this patent is extended or adjusted under 35 U.S.C. 154(b) by 288 days.

(21) Appl. No.: 14/802,876

(22) Filed: Jul. 17, 2015

(65) Prior Publication Data

US 2017/0018401 A1 Jan. 19, 2017

(51) Int. Cl.
*G01R 19/25* (2006.01)
*H01J 37/244* (2006.01)

(52) U.S. Cl.
CPC ... *H01J 37/244* (2013.01); *H01J 2237/24564* (2013.01)

(58) Field of Classification Search
CPC .. G01R 31/025; G01R 31/006; G01R 31/021; G01R 31/40; G01R 27/18; G01R 31/024; G01R 31/026; G01R 19/0084; G01R 19/25; G01R 19/2513; G01R 19/10; G01R 19/16528; G01R 31/003; G01R 31/2621
USPC ..... 324/537, 754.24, 401, 754.16, 421, 525, 324/691, 756.06, 600, 176
See application file for complete search history.

(56) References Cited

U.S. PATENT DOCUMENTS

| 878,936 A | * | 2/1908 | Grund | F01D 21/16 |
| | | | | 123/345 |
| 6,013,155 A | | 1/2000 | McMillin et al. | |
| 6,199,506 B1 | * | 3/2001 | Hilliker | C23C 16/4405 |
| | | | | 118/723 E |

(Continued)

FOREIGN PATENT DOCUMENTS

EP 0838841 A2 4/1998

OTHER PUBLICATIONS

Wattco, "Tubular Heaters", http://www.waltco.com/articles/Tubular-Heaters-articles.html, printed on May 26, 2015, 2 pages.

(Continued)

*Primary Examiner* — Jermele M Hollington
*Assistant Examiner* — Taqi Nasir
(74) *Attorney, Agent, or Firm* — Martine Penilla Group, LLP

(57) ABSTRACT

Systems and methods for determining a fault in a gas heater channel are described. One of the methods includes receiving measured parameters associated with a plurality of heater elements of the gas heater channel. The gas heater channel transfers one or more gases from a gas supply to a plasma chamber. The method further includes calculating a measured parallel resistance of the plurality of heater elements from the measured parameters, comparing the measured parallel resistance to an ideal parallel resistance of the heater elements of the gas heater channel, and determining based on the comparison that a portion of the gas heater channel is inoperational. The method includes selecting an identity of one of the heater elements from a correspondence between a plurality of identities of the heater elements and the measured parallel resistance.

20 Claims, 14 Drawing Sheets

(56) References Cited

U.S. PATENT DOCUMENTS

| | | | | | |
|---|---|---|---|---|---|
| 6,399,506 | B2* | 6/2002 | Lin | | H01L 21/31055 |
| | | | | | 257/E21.245 |
| 8,264,235 | B2* | 9/2012 | De Vries | | H01L 22/34 |
| | | | | | 324/525 |
| 8,278,936 | B2* | 10/2012 | Grund | | G01R 31/002 |
| | | | | | 324/537 |
| 8,872,529 | B2* | 10/2014 | Aoyama | | B23K 11/258 |
| | | | | | 324/691 |
| 8,928,338 | B2* | 1/2015 | Nelson | | F02D 41/1466 |
| | | | | | 324/464 |
| 2002/0153350 | A1* | 10/2002 | Lu | | C23C 16/45519 |
| | | | | | 216/67 |
| 2003/0022519 | A1* | 1/2003 | Fujioka | | C23C 16/509 |
| | | | | | 438/758 |
| 2007/0194009 | A1* | 8/2007 | Seger | | H05B 1/0236 |
| | | | | | 219/600 |
| 2008/0183404 | A1* | 7/2008 | Emami | | G01R 31/024 |
| | | | | | 702/34 |
| 2009/0314208 | A1 | 12/2009 | Zhou et al. | | |
| 2010/0151687 | A1 | 6/2010 | Dhindsa et al. | | |
| 2012/0097661 | A1* | 4/2012 | Singh | | H01L 21/67109 |
| | | | | | 219/446.1 |
| 2014/0096909 | A1 | 4/2014 | Singh et al. | | |

OTHER PUBLICATIONS

Storr, Wayne, Basic Electronic Tutorials Site, "MOSFET as a Switch", http//www.electronics-tutorials.ws/transistor/tran_7.html, May 25, 2015, 14 pages.

* cited by examiner

METHODS AND SYSTEMS FOR DETERMINING A FAULT IN A GAS HEATER CHANNEL

FIELD

The present embodiments relate to systems and methods for determining a fault in a gas heater channel.

BACKGROUND

Plasma systems are used to perform various operations on a wafer. For example, the plasma systems are used to clean the wafer, etch the wafer, or deposit materials on the wafer.

To perform the operation, a gas is supplied to a plasma chamber. The gas is heated before being provided to the plasma chamber.

It is in this context that embodiments described in the present disclosure arise.

SUMMARY

Embodiments of the disclosure provide apparatus, methods and computer programs for determining a fault in a gas heater channel. It should be appreciated that the present embodiments can be implemented in numerous ways, e.g., a process, or an apparatus, or a system, or a piece of hardware, or a method, or a computer-readable medium. Several embodiments are described below.

In one embodiment, a system for identifying a heater element of a gas heater channel is described. The gas heater channel includes two heater elements. The system includes a voltage measurement device and a current measurement device. The voltage measurement device is connected in parallel to each heater element of the gas heater channel and the current measurement device is connected in series to the gas heater channel. Such connections of the measurement devices facilitate identification of a heater element that is inoperational, e.g., is open, is malfunctioning, is broken, etc. A processor receives the voltage and current that are measured by the measurement devices and calculates a measured parallel resistance. The processor determines whether the measured parallel resistance is similar to a first ideal parallel resistance of the gas heater channel or a second ideal parallel resistance of the gas heater channel. The first ideal parallel resistance is calculated using an assumption that the first heater element is inoperational and the second ideal parallel resistance is calculated using an assumption that the second heater element is inoperational. Upon determining that the measured parallel resistance is similar to the first ideal parallel resistance, the processor determines that the first gas heater element is inoperational and upon determining that the measured parallel resistance is similar to the second ideal parallel resistance, the processor determines that the second gas heater element is inoperational.

In an embodiment, a method for determining a fault in a gas heater channel is described. The method includes receiving from one or more sensors measured parameters associated with a plurality of heater elements of the gas heater channel. The gas heater channel transfers one or more gases from a gas supply to a plasma chamber. The method further includes calculating a measured parallel resistance of the plurality of heater elements from the measured parameters, comparing the measured parallel resistance to an ideal parallel resistance of the heater elements of the gas heater channel, and determining based on the comparison that a portion of the gas heater channel is inoperational. The method includes selecting an identity of one of the heater elements from a correspondence between a plurality of identities of the heater elements and the measured parallel resistance. The selection of the identity facilitates identification of the portion of the gas heater channel having the fault.

In one embodiment, a method for determining a fault in a gas heater channel is described. The method includes receiving from one or more sensors measured parameters associated with a first plurality of heater elements of the gas heater channel. The gas heater channel transfers one or more gases from a gas supply to a plasma chamber. The method further includes calculating a measured parallel resistance of the first plurality of heater elements from the measured parameters associated with the first plurality of heater elements, comparing the measured parallel resistance of the first plurality of heater elements to an ideal parallel resistance of the first plurality of heater elements of the gas heater channel, and determining based on the comparison that the first plurality of heater elements is operational. The method also includes receiving from the one or more sensors measured parameters associated with a second plurality of heater elements of the gas heater channel, calculating a measured parallel resistance of the second plurality of heater elements from the measured parameters associated with the second plurality of heater elements, and comparing the measured parallel resistance of the second plurality of heater elements to an ideal parallel resistance of the second plurality of heater elements of the gas heater channel. The method includes determining based on the comparison that the second plurality of heater elements is inoperational and selecting an identity of one of the heater elements of the second plurality of heater elements from a correspondence between a plurality of identities and the measured parallel resistance of the second plurality of heater elements. The selection of the one or more identities facilitates identification of a portion of the gas heater channel having the fault.

In an embodiment, a system for determining a fault in a gas heater channel is described. The system includes an alternating current (AC) source configured to generate AC power, a rectifier coupled to the AC source and configured to convert the AC power into pulsing direct current (DC) power, and a transistor. The system further includes a gate drive coupled to the rectifier and to the transistor and configured to drive the transistor, a channel of heater elements, and a current sensor coupled to the transistor and to the channel of heater elements and configured to sense a current provided to the channel of heater elements. The current is provided when the transistor is driven. Each of the heater elements has a first node and a second node. The system includes a voltage sensor coupled to the first node of the heater elements and the second node of the heater elements and configured to measure voltage across each of the heater elements. The system also includes a processor coupled to the voltage sensor and the current sensor. The processor receives the voltage measured by the voltage sensor and the current sensed by the current sensor, calculates a parallel resistance from the voltage and the current, and determines whether the calculated parallel resistance is within a pre-determined threshold of an ideal parallel resistance of the heater elements. The processor further determines that a portion of the channel is inoperational upon determining that the parallel resistance is not within the pre-determined threshold of the ideal parallel resistance. The processor selects an identity of one of the heater elements from a correspondence between a plurality of identities and the calculated parallel resistance. The selection of the identity facilitates identification of the portion of the channel having the fault.

Some advantages of the herein described systems and methods include identifying a heater element that is inoperational by calculating the measured parallel resistance. A gas heater channel includes tens and sometimes hundreds of heater elements, and if one of those heater elements becomes inoperational, it is difficult for a user to determine which of the heater elements has become inoperational. The systems and methods described above help identify the heater element that has become inoperational.

Other advantages of the herein described systems and methods include providing pulsed direct current (DC) power to heater elements of a gas heater channel. The pulsed DC power is more stable compared to alternating current (AC) power and facilitates a stable measurement of voltage and current associated with the heater elements. The voltage and current are used to identify a heater element that is inoperational. Without the stability, it is difficult to identify the inoperational heater element.

Other aspects will become apparent from the following detailed description, taken in conjunction with the accompanying drawings.

BRIEF DESCRIPTION OF THE DRAWINGS

The embodiments are understood by reference to the following description taken in conjunction with the accompanying drawings.

FIG. 3C-2 is a diagram to illustrate identification of a sub-heater element or another sub-heater element that is inoperational.

DETAILED DESCRIPTION

The following embodiments describe systems and methods for determining a fault in a gas heater channel. It will be apparent that the present embodiments may be practiced without some or all of these specific details. In other instances, well known process operations have not been described in detail in order not to unnecessarily obscure the present embodiments.

Figure 1A:
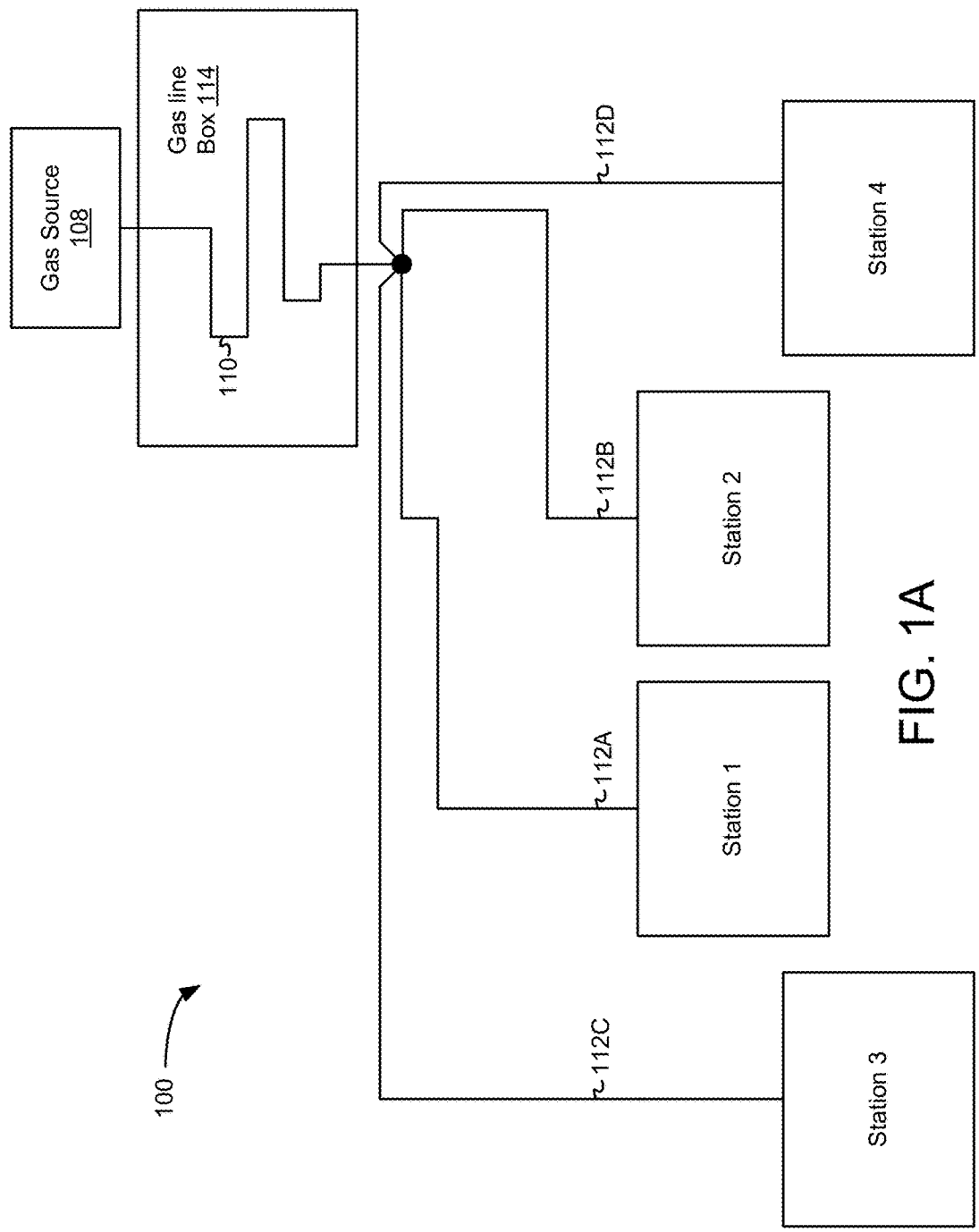
FIG. 1A is a diagram of an embodiment of a system for illustrating gas heater channels.

FIG. 1A is a diagram of an embodiment of a system 100 for illustrating a number of gas heater channels 110, 112A, 112B, 112C, and 112D. The system 100 includes multiple stations 1, 2, 3, and 4, a gas source 108, and a gas line box 114. Examples of a station include a plasma chamber. For example, the station 1 is used to pre-clean a substrate, e.g., a semiconductor wafer, a substrate for a flat panel display, etc. The station 2 is used to deposit materials on the substrate, the station 3 is used to etch deposited materials from the substrate, and the station 4 is used to post-clean the substrate.

The gas source 108 is an enclosure, e.g., a gas tank, etc., that stores one or more process gases, e.g., oxygen-containing gas, a fluorine-containing gas, a nitrogen-containing gas, a combination of two or more thereof, etc. The gas line box 114 includes a flow control unit for adjusting a flow of the one or more process gases, e.g., a process gas for cleaning, a process gas for deposition, a process gas for sputtering, a process gas for etching, etc. For example, the gas line box 114 includes a driver, e.g., one or more transistors, etc., that drive a flow valve to control a flow rate of the one or more gases within the gas heater channel 110. The driver is connected to a flow controller, e.g., a processor and a memory device, etc., and the controller provides a signal to the driver to drive the flow valve. A processor, as used herein, refers to a central processing unit (CPU), an application specific integrated circuit (ASIC), or a programmable logic device (PLD) is used, and these terms are used interchangeably herein. Examples of a memory device include a read-only memory (ROM), a random access memory (RAM), a hard disk, a volatile memory, a non-volatile memory, a redundant array of storage disks, a Flash memory, etc.

In an embodiment, the flow rate is controlled by a motor that is connected to a valve and the valve is controlled by the flow controller via the motor and a driver, e.g., one or more transistors, etc., of the motor.

A flow splitter is connected to the gas heater channel 110 to split the gas heater channel 110 into multiple gas heater channels 112A thru 112D. The gas heater channel 112A supplies the one or more process gases to the station 1, the gas heater channel 112B supplies the one or more process gases to the station 2, the gas heater channel 112C supplies the one or more process gases to the station 3, and the gas heater channel 112D supplies the one or more process gases to the station 4.

It should be noted that although four stations are illustrated in FIG. 1A, in an embodiment, any other number of stations are connected to the gas heater channel 110 via the same number of gas heater channels. For example, the gas heater channel 110 is split into three gas heater channels to supply the one or more process gases to the stations 1, 2, and 3. In this example, the system 100 does not include the station 4.

Moreover, it should further be noted that although one gas source 108 is illustrated in FIG. 1A, in one embodiment, more than one gas source is used to supply process gases to one or more of the stations 1 thru 4. For example, the other gas source supplies a process gas to the stations 1 and 2 and not to the stations 3 and 4.

In one embodiment, a flow rate of flow of the one or more process gases flowing within each of the gas heater channels 112A thru 112D is controlled separately. For example, a flow valve within the gas heater channel 112A is controlled by the flow controller in a manner described above to increase or decrease a flow rate of the one or more process gases flowing via the gas heater channel 112A and a flow valve within the gas heater channel 112B is controlled by the flow controller in a manner described above to adjust a flow rate of the one or more process gases flowing via the gas heater channel 112B.

Figure 1B:
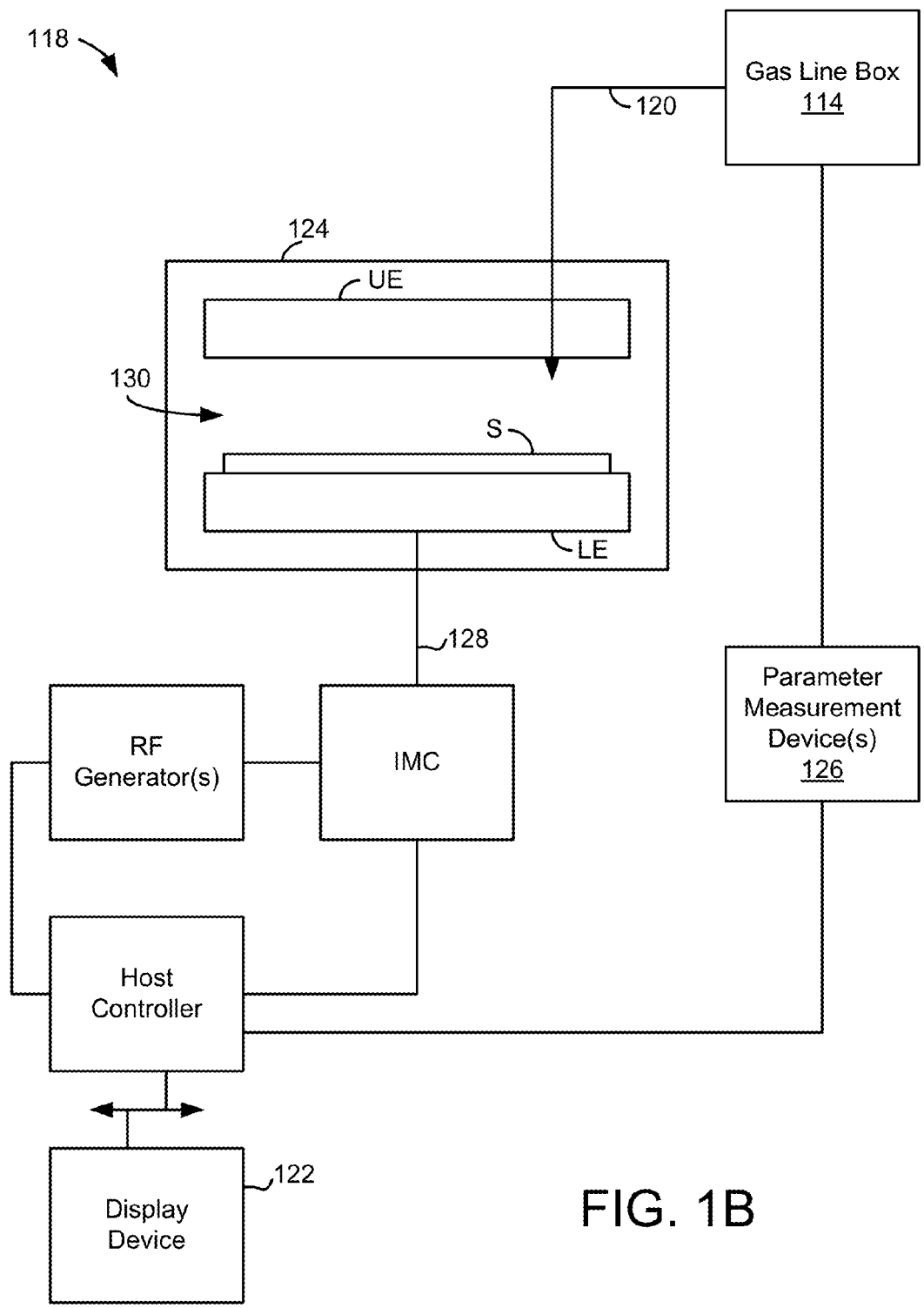
FIG. 1B is a diagram of an embodiment of a system used to determine a fault in a gas heater channel.

FIG. 1B is a diagram of an embodiment of a system 118 used to determine a fault in a combination gas heater channel, which is a combination of the gas heater channel 110 and a gas heater channel 120. The gas heater channel 120 is an example of any of the gas heater channels 112A thru 112D (FIG. 1A).

The system 118 includes the gas line box 114, the gas heater channel 120, a plasma chamber 124, one or more parameter measurement device(s) 126, an impedance matching circuit (IMC), one or more radio frequency (RF) generators, a host controller, and a display device 122. Examples of the RF generators include a 400 kilohertz (kHz) RF generator, a 2 megahertz (MHz) RF generator, a 27 MHz RF generator, and a 60 MHz RF generator. The host controller is connected to the display device 122 via a bus. Examples of the display device 122 include a cathode ray tube (CRT) display device, a plasma display device, a light emitting diode (LED) display device, a liquid crystal display (LCD) device, etc. The flow controller, mentioned above, is an example of the host controller.

An example of the parameter measurement device(s) 126 includes a voltmeter and an ammeter. Another example of the parameter measurement device(s) includes an ohmmeter.

The plasma chamber 124 includes an upper electrode (UE) and a lower electrode (LE), on which a substrate S is placed for processing using the one or more process gases. Each of the upper electrode and the lower electrode is made of a metal, e.g., aluminum, alloy of aluminum, etc. The lower electrode is a part of a chuck, e.g., an electrostatic chuck (ESC), etc., within the plasma chamber 124. The lower electrode faces the upper electrode.

In one embodiment, the upper electrode is grounded.

The host controller provides a signal indicating a corresponding amount of power to be generated by each of the RF generators to each of the RF generators. For example, the host controller provides a signal via a cable to the 2 MHz RF generator. The signal indicates to a digital signal processor (DSP) of the 2 MHz RF generator to control an RF supply within the RF generator to generate an RF signal having an amount of power indicated in the signal received from the host controller. Moreover, the host controller provides another signal via another cable to the 27 MHz RF generator. The signal indicates to a DSP of the 27 MHz RF generator to generate an RF signal having an amount of power indicated in the other signal received from the host controller.

The RF generators generate the RF signals and send the RF signals via corresponding RF cables to the impedance matching circuit. For example, the 2 MHz RF generator generates an RF signal and sends the RF signal via an RF cable to the impedance matching circuit and the 27 MHz RF generator generates an RF signal and sends the RF signal via an RF cable to the impedance matching circuit.

The impedance matching circuit receives the RF signals and filters the RF signals to match an impedance of a load connected to an output of the impedance matching circuit with that of a source connected to inputs of the impedance matching circuit. For example, the impedance matching circuit matches an impedance of an RF transmission line 128 that connects the impedance matching circuit to the lower electrode LE and the plasma chamber 124 with that of the RF generators and the RF cables that connect the RF generators to the impedance matching circuit. The impedance matching circuit matches the impedance of the load with that of the source to generate a modified RF signal, which is transferred via the RF transmission line 128 to the lower electrode.

When the one or more process gases are supplied via the gas heater channel 120 to a gap 130 between the upper electrode and the lower electrode and the modified RF signal is supplied to the lower electrode, plasma is stricken within the gap 130. If plasma is already stricken at a time the one or more process gases are supplied to the gap 130 and the modified RF signal is transferred to the lower electrode, the plasma is maintained within the gap 130.

Temperature of the one or more process gases in the combination gas heater channel is controlled by heating the one or more process gases. The combination gas heater channel includes heater elements that heat the one or more process gases. Due to a variety of reasons, e.g., overheating, excessive electrical current supply, wear and tear, etc., one or more of the heater elements of the combined gas heater channel become inoperational, e.g., malfunction, faulty, do not operate, burn and break, form an open circuit, etc. A gas heater channel includes tens or hundreds or sometimes even thousands of heater elements. It is difficult for a user to diagnose which of the heater elements is inoperational.

The parameter measurement device(s) 126 are connected to the combined gas heater channel to measure parameters, e.g., voltage, current, etc. For example, the ammeter measures a current that passes through any of the heater elements of the combined gas heater channel and the voltmeter measures a voltage across each of the heater elements. The current and the voltage are provided from the parameter measurement device(s) 126 to the host controller. The host controller calculates parallel resistance of the heater elements of the combined gas heater channel from the voltage and the current. From the parallel resistance, one or more of the heater elements that are inoperational are identified by the host controller and identities of the one or more of the heater elements are displayed on the display device 122 to the user.

It should be noted that in an embodiment, the modified RF signal is provided to the upper electrode and the lower electrode is grounded instead of grounding the upper electrode and providing the modified RF signal to the lower electrode.

Figure 2A:
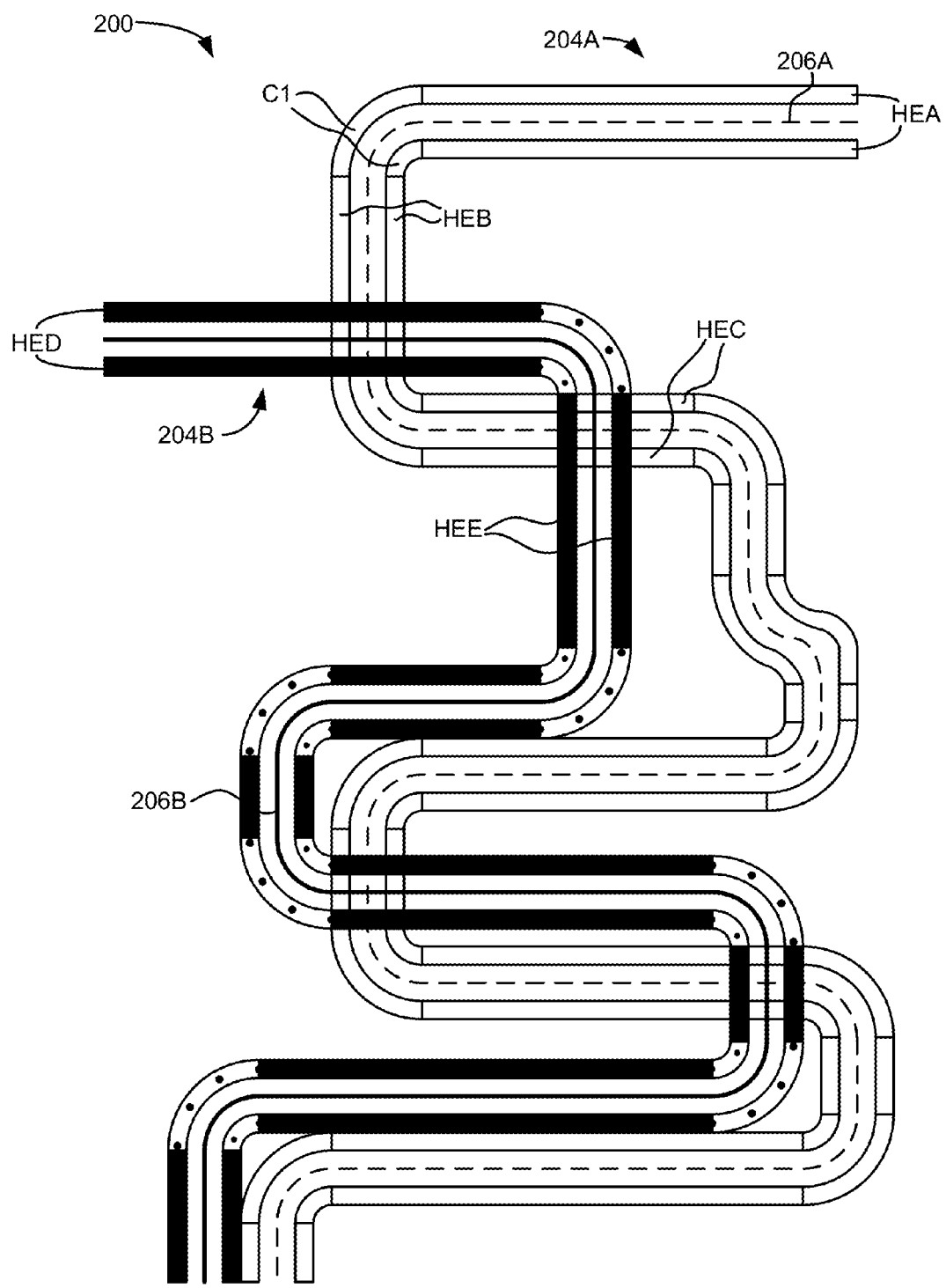
FIG. 2A is a diagram of an embodiment of a system to illustrate a complexity of arrangement of gas heater channels.

FIG. 2A is a diagram of an embodiment of a system 200 to illustrate a complexity of arrangement of gas heater channels 204A and 204B. The system 200 shows the gas heater channels 204A and 204B. The gas heater channel 204A includes heater elements HEA, HEB, HEC, and other heater elements. Moreover, the gas heater channel 204B includes heater elements HED, HEE, and other heater elements. The gas heater channel 204A or the gas heater channel 204B is located within the gas line box 114 (FIG. 1A) or outside the gas line box 114.

A gas line 206A is located within the gas heater channel 204A and another gas line 206B is located within the heater channel 204B. The gas line 206A delivers one or more process gases to one or more stations and the gas line 206B delivers one or more process gases to one or more stations.

Each heater element is connected to another heater element via a connector. For example, the heater element HEA is connected to the heater element HEB via a connector C1.

Each gas heater channel 204A and 204B includes a large number of heater elements. When a device is connected in series to an end of the gas heater channel 204A to determine whether the gas heater channel 204A is inoperational, if one or more of the heater elements of the gas heater channel 204A are inoperational, the device does not measure any current. However, when no current is measured using the device, it is difficult to determine which of the heater elements of the gas heater channel 204A are inoperational.

Figure 2B:
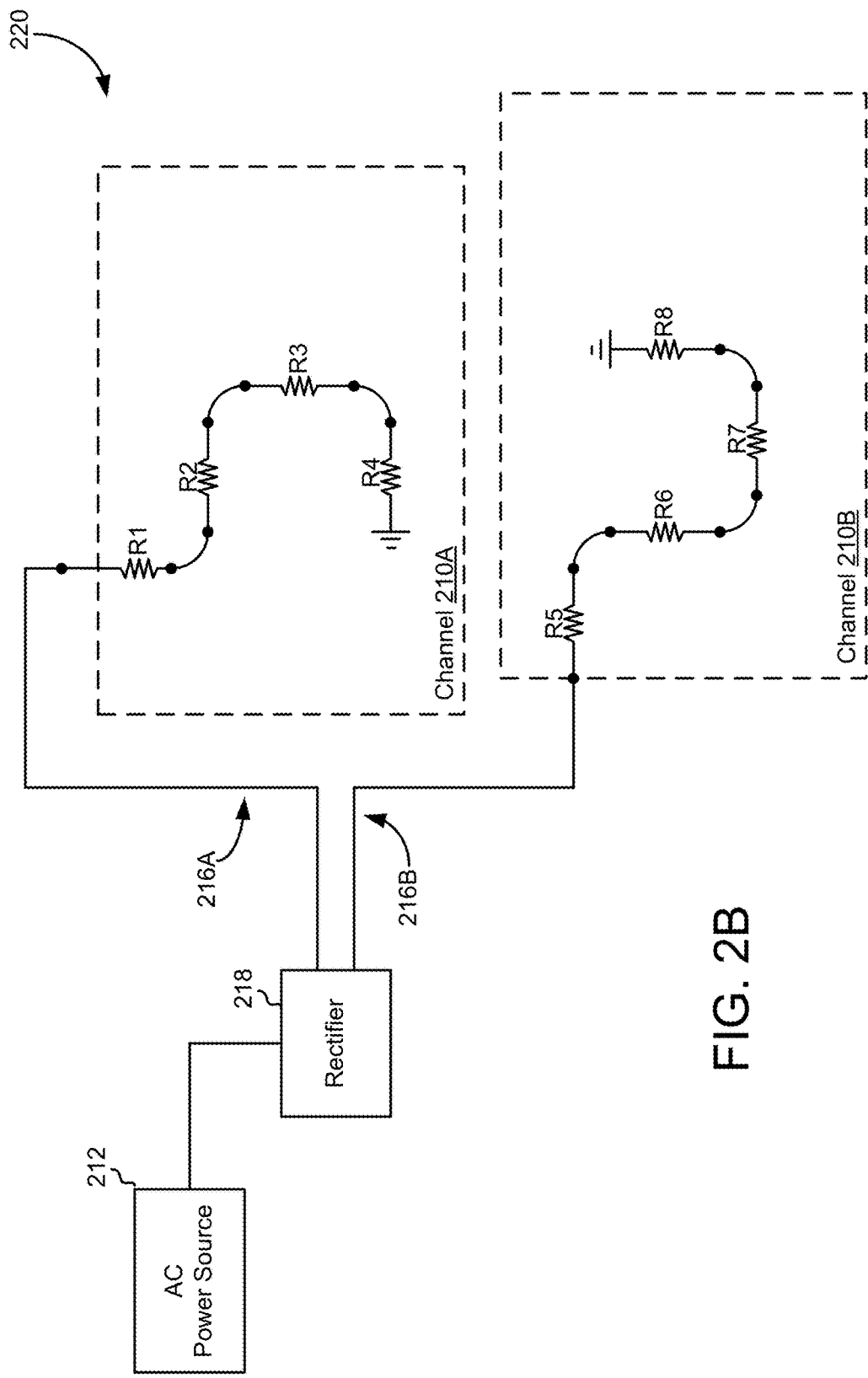
FIG. 2B is a diagram of an embodiment of system to illustrate that pulsed direct current (DC) power is provided to gas heater channels.

FIG. 2B is a diagram of an embodiment of system 220 to illustrate that pulsed direct current (DC) power is provided to gas heater channels 210A and 210B. The system 220 includes an alternating current (AC) power source 212, a rectifier 218, and the channels 210A and 210B.

The gas heater channel 210A includes resistors R1, R2, R3, and R4, which are connected in series with each other. Moreover, the gas heater channel 210B includes resistors R5, R6, R7, and R8, which are connected in series with each other.

In an embodiment, each gas heater channel 210A and 210B includes any other number of resistors than that illustrated using FIG. 2B. For example, the gas heater channel 210A includes 20 resistors connected in series and the gas heater channel 210B includes 40 resistors in series.

The AC power source 212 generates AC power, e.g., sinusoidal power, power that oscillates peak-to-peak and while oscillating becomes zero, etc., and provides the AC power to the rectifier 218. The rectifier 218 converts the AC power into pulsed DC power, which is further described below. The rectifier 218 provides a portion of the pulsed DC power via a path 216A, e.g., a wire connection, etc., to the gas heater channel 210A and provides the remaining portion of the pulsed DC power via a path 216B to the gas heater channel 210B. When the portion of the pulsed DC power is supplied to the gas heater channel 210A, the gas heater channel 210A operates at a temperature tempt. For example, temperature of one or more process gases within a gas line within the gas heater channel 210A is temp1. Similarly, when the portion of the pulsed DC power is supplied to the gas heater channel 210B, the gas heater channel 210B operates at a temperature temp2.

Figure 3A:
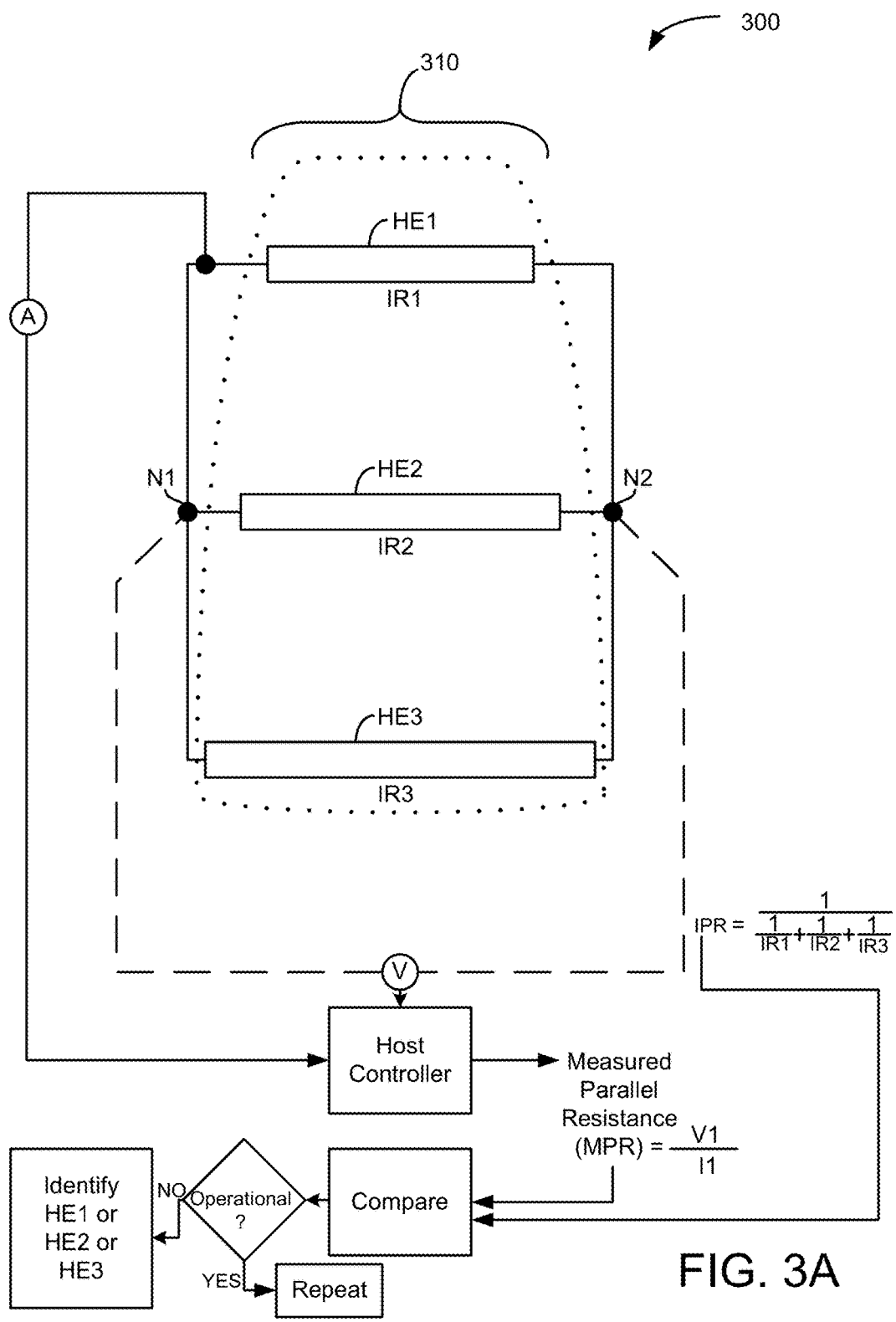
FIG. 3A is a diagram of an embodiment of a system to illustrate use of parallel resistance to determine whether there is a fault in a gas heater channel.

FIG. 3A is a diagram of an embodiment of a system 300 to illustrate use of parallel resistance to determine whether there is a fault in a gas heater channel 310. The gas heater channel 310 is an example of any of the gas heater channels 110, 112A, 112B, 112C, 112D (FIG. 1A), and any other gas heater channel described herein. The system 300 includes the gas heater channel 310, an ammeter A, a voltmeter V, and the host controller. The gas heater channel 310 includes heater elements HE1, HE2, and HE3. The heater elements HE1, HE2, and HE3 are connected in series in the gas heater channel 310. For example, the heater element HE1 is connected via a connector to the path 216A and is connected via a connector to the heater element HE2, the heater element HE2 is connected via a connector to the heater element HE3, and the heater element HE3 is grounded via a connector. As another example, the heater element HE1 includes the resistor R1 (FIG. 2B), the heater element HE2 includes the resistor R2 (FIG. 2B), and the heater element HE3 includes the resistor R3 (FIG. 2B), which is grounded.

In one embodiment, the gas heater channel 310 includes any other number of heater elements, e.g., two, ten, twenty, forty, sixty, hundred, two hundred, in tens, in hundreds, etc., and the heater elements are connected in series.

The voltmeter V is connected in parallel to a node N1 of each of the heater elements HE1, HE2, and HE3 and to a node N2 of each of the heater elements H1, H2, and H3. Similarly, the ammeter A is connected in series with the node N1 of any of the heater elements HE1, HE2, and HE3. In one embodiment, instead of the node N1, the ammeter A is connected in series with the node N2 of any of the heater elements HE1, HE2, and HE3. The voltmeter V is connected to the nodes N1 and N2 of the heater elements HE1, HE2, and HE3 by the user and the ammeter A is connected to the node N1 of any of the heater elements HE1, HE2, and HE3 by the user.

An ideal parallel resistance IPR of the gas heater channel 310 is calculated by the host controller. For example, the ideal parallel resistance IPR is calculated as:

$$IPR=1/\{(1/IR1)+(1/IR2)+(1/IR3)\} \quad (1),$$

where IR1 is an ideal resistance of the heater element HE1, IR2 is an ideal resistance of the heater element HE2, and IR3 is an ideal resistance of the heater element HE3. The resistances IR1, IR2, and IR3 are accessed by the host controller from a specification database, e.g., specification file, etc., which is stored in the memory device of the host controller or is accessed via a computer network, e.g., local area network, wide area network, etc., by a host computer that includes the host controller. As another example, when the gas heater channel 310 is initially installed or serviced in a plasma system to heat one or more process gases, the voltmeter V measures a voltage between the nodes N1 and N2, and the ammeter A measures a current that passes through any of the heater elements HE1, HE2, and HE3. For example, the ammeter A measures the current at the node N1 of the heater element HE1 or the heater element HE2 or the heater element HE3. The current and the voltage measured are provided to the host controller, which calculates a commissioned resistance, e.g., the ideal parallel resistance IPR, etc., from the current and the voltage. For example, the host controller calculates the commissioned resistance as a ratio of the voltage and current.

During operation of the gas heater channel 310 in a plasma system, e.g., a period of time after the initial installation or service, a period of time after the gas heater channel 310 is used within the plasma system, after wear and tear of the gas heater channel 310, etc., the voltmeter V measures a voltage V1 across the nodes N1 and N2 of the heater elements HE1, HE2, and HE3 and the ammeter A measures a current I1 at the node N1 of any of the heater elements HE1, HE2, and HE3. The current I1 is a current that flows through any or all of the heater elements HE1, HE2, and HE3. The current I1 is provided by the ammeter A to the host controller and the voltage V1 is provided by the voltmeter V to the host controller.

The host controller calculates a measured parallel resistance MPR from the current I1 and the voltage V1. For example, the host controller calculates the measured parallel resistance to be V1/I1, which is a ratio of V1 and I1. The host controller compares the measured parallel resistance MPR with the ideal parallel resistance IPR to determine whether the measured parallel resistance MPR is within a predetermined threshold THRHOLD, e.g., same as, within a predetermined range from, etc., of the ideal parallel resistance IPR. Upon determining that the measured parallel resistance MPR is within the predetermined threshold THRHOLD of the ideal parallel resistance IPR, the host controller determines that the gas heater channel 310 is operational, e.g., all the heater elements HE1, HE2, and HE3 are operational, etc. On the other hand, upon determining that the measured parallel resistance MPR is not within the predetermined threshold THRHOLD of the ideal parallel resistance IPR, the host controller determines that the gas heater channel 310 is inoperational, e.g., a portion of the gas heater channel 310 is inoperational, etc. For example, the heater element HE1 or the heater element HE2, or the heater element HE3, or a connector between the heater element HE1 and the heater element HE2, or a connector between the heater element HE2 and the heater element HE3, or a connector coupled between the heater element HE1 and the path 216A (FIG. 2B), or a connector coupled to the heater element HE3 to ground the heater element HE3, or a combination of two or more thereof, etc., is inoperational.

In one embodiment, a heater element is inoperational when a resistor of the heater element is inoperational. In an embodiment, a connector is inoperational when a connection medium, which is described below, of the connector is inoperational.

It should be noted that when the voltmeter V is connected to the nodes N1 and N2 of the heater elements HE1, HE2, and HE3, the heater element HE1 is in series with the heater element HE2, which is in series with the heater element HE3. The connection of the voltmeter V facilitates calculation of the measured parallel resistance MPR. Similarly, when the ammeter A is connected to the node N1 of any of the heater elements HE1, HE2, and HE3, the heater elements HE1, HE2, and HE3 are connected in series with each other. The connection of the ammeter A facilitates calculation of the measured parallel resistance MPR.

In one embodiment, the heater element HE1 has a different resistance than that of the heater element HE2, and the heater element HE2 has a different resistance than each of the heater elements HE1 and HE3. For example, a resistor of the heater element HE1 is of a different length than a length of resistor of a resistor of the heater element HE2 and/or a cross-sectional area of the resistor of the heater element HE1 is different than a cross-sectional area of the resistor of the heater element HE2.

Figure 3B:
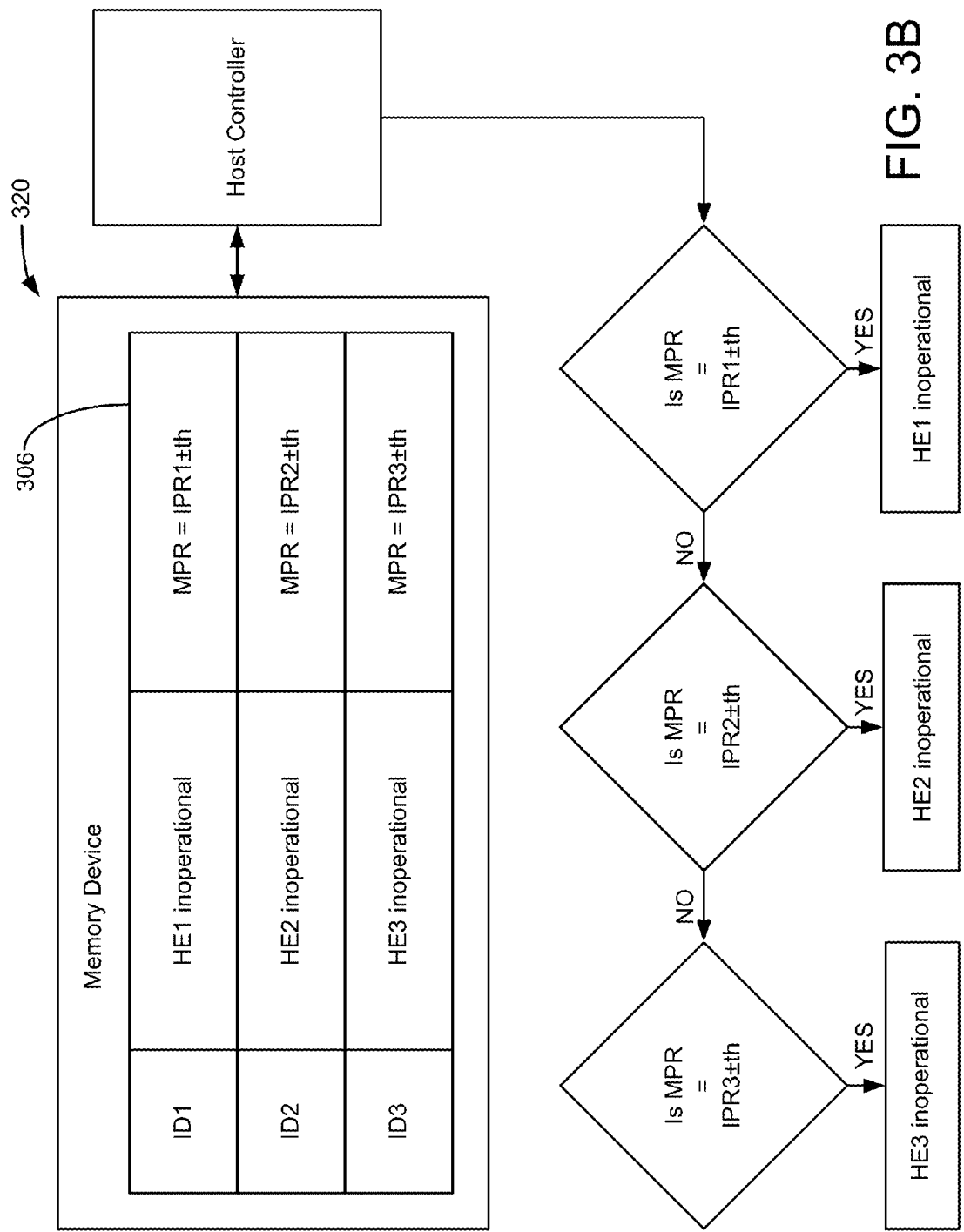
FIG. 3B is a diagram of an embodiment of a system for identifying a heater element that is inoperational.

FIG. 3B is a diagram of an embodiment of a system 320 for identifying the heater element HE1, HE2, or HE3 that is inoperational. The memory device of the host controller stores a database 306, e.g., a correspondence, a mapping, an association, links, etc., between an identity of a heater element that is inoperational and a value of the measured parallel resistance MPR. For example, the database 306 includes a mapping between an identity ID1 of the heater element HE1 and a value IPR1 of the ideal parallel resistance IPR. Moreover, the database 306 includes a mapping between an identity ID2 of the heater element HE2 and a value IPR2 of the ideal parallel resistance IPR and includes a mapping between an identity ID3 of the heater element HE3 and a value IPR3 of the ideal parallel resistance IPR.

The ideal parallel resistance IPR is calculated to be IPR1 by the host controller when the ideal resistance IR1 is not applied in the equation (1) by the host controller to calculate the ideal parallel resistance IPR. Similarly, the ideal parallel resistance IPR is calculated to be IPR2 when the ideal resistance IR2 is not applied in the equation (1) by the host controller to calculate the ideal parallel resistance IPR and the ideal parallel resistance IPR is calculated to be IPR3 when the ideal resistance IR3 is not applied in the equation (1) by the host controller to calculate the ideal parallel resistance IPR. The ideal parallel resistances IPR1, IPR2, and IPR3 are stored in the database 306 by the host controller.

In one embodiment, the ideal parallel resistance IPR1 is calculated when the voltmeter V is connected to the node N1 of the heater elements HE2 and HE3 and not to the node N1 of the heater element HE1, and is connected to the node N2 of the heater elements HE2 and HE3 and not to the node N2 of the heater element HE1, and the ammeter A is connected to the node N1 of any of the heater elements HE2 and HE3 and not of the heater element HE1. Moreover, the ideal parallel resistance IPR2 is calculated when the voltmeter V is connected to the node N1 of the heater elements HE1 and HE3 and not to the node N1 of the heater element HE2, and is calculated when the voltmeter V is connected to the node N2 of the heater elements HE1 and HE3 and not to the node N2 of the heater element HE2, and the ammeter A is connected to the node N1 of any of the heater elements HE1 and HE3 and not of the heater element HE2. Also, the ideal parallel resistance IPR3 is calculated when the voltmeter V is connected to the node N1 of the heater elements HE1 and HE2 and not to the node N1 of the heater element HE3, and is connected to the node N2 of the heater elements HE1 and HE2 and not to the node N2 of the heater element HE3, and the ammeter A is connected to the node N1 of any of the heater elements HE1 and HE2 and not of the heater element HE3.

The host controller determines whether the measured parallel resistance MPR has a value that is within a pre-determined threshold th, e.g., same as, within a pre-determined range from, etc., of the value IPR1. Upon determining that the measured parallel resistance MPR has a value that is within the pre-determined threshold th of the value IPR1, the host controller determines that the heater element HE1 is inoperational and accesses the identity ID1 from the database 306 to display via the display device 122 to the user. It should be noted that when the identity ID1 is displayed, the heater element HE1 and/or a connector coupled to the heater element HE1 is inoperational.

On the other hand, upon determining that the measured parallel resistance MPR has a value that is not within the pre-determined threshold th of the value IPR1, the host controller determines whether the measured parallel resistance MPR has a value that is within the pre-determined threshold th of the value IPR2. Upon determining that the measured parallel resistance MPR has a value that is within the pre-determined threshold th of the value IPR2, the host controller determines that the heater element HE2 is inoperational and accesses the identity ID2 from the database 306 for display via the display device 122 to the user. It should be noted that when the identity ID2 is displayed, the heater element HE2 and/or a connector coupled to the heater element HE2 is inoperational.

Upon determining that the measured parallel resistance MPR has a value that is not within the pre-determined threshold th of the value IPR2, the host controller determines whether the measured parallel resistance MPR has a value that is within the pre-determined threshold th of the value IPR3. Upon determining that the measured parallel resistance MPR has a value that is within the pre-determined threshold th of the value IPR3, the host controller determines that the heater element HE3 is inoperational and accesses the identity ID3 from the database 306 to display via the display device 122 to the user. It should be noted that when the identity ID3 is displayed, the heater element HE3 and/or a connector coupled to the heater element HE3 is inoperational.

It should be noted that in an embodiment, an identity of a heater element is provided to the user in the form of a sound via audio equipment, e.g., amplifier and speaker, etc., instead of or in addition to using the display device 122.

In one embodiment, an identity of a heater element is transferred via the computer network to another host computer to display to the user and/or to provide to the user in the form of sound.

Figures 1, 3C:
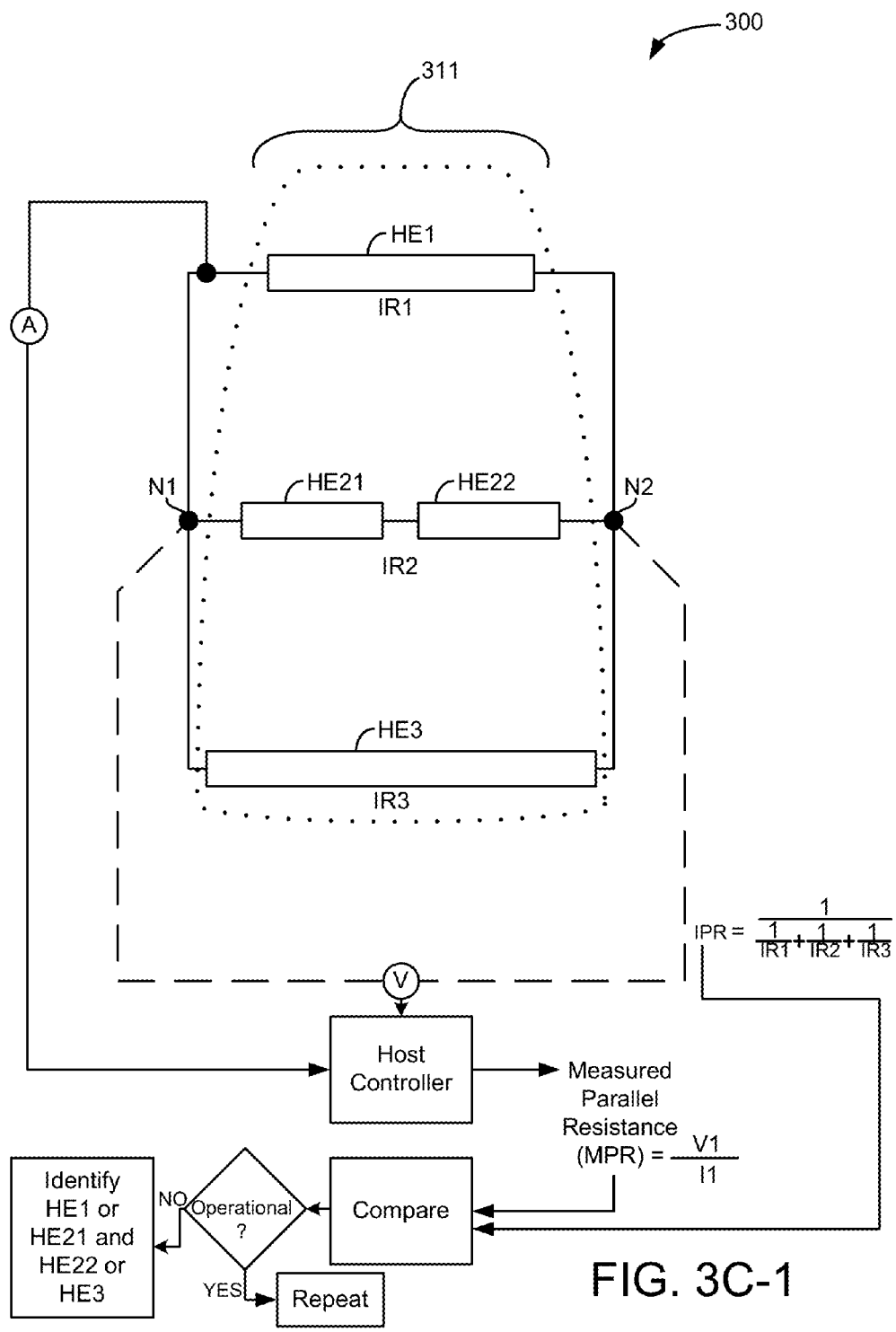
FIG. 3C-1 is a diagram of an embodiment of a system to illustrate identification of a sub-heater element that is inoperational.

FIG. 3C-1 is a diagram of an embodiment of a system 330 to illustrate identification of a sub-heater element HE21 or HE22 that are portions of a combined heater element, e.g., the heater element HE2, etc. For example, the combined heater element includes two sub-heater elements HE21 and HE22 instead of being one heater element. As another example, the combined heater element includes two resistors R21 and R22 instead of including one resistor R2. The sub-heater element H21 is connected to the heater element HE1 via a connector and the sub-heater element H22 is connected to the heater element HE3 via a connector.

In one embodiment, the sub-heater elements HE21 and HE22 are connected with each other via a connector.

The sub-heater elements HE21 and HE22 are connected in series with each other and to the heater element HE1 and to the heater element HE3 when implemented within a channel 311, which is an example of the channel 110, or the channel 112A, or the channel 112B, or the channel 112C, or the channel 112D (FIG. 1A). For example, the combined heater element is connected via a connector to the heater element HE1 and is connected via a connector to the heater element HE3.

The ideal parallel resistance IPR of the channel 311 is calculated in one of various manners described above of calculating the ideal parallel resistance IPR of the channel 310 except that IR2 is a total resistance of the sub-heater elements HE21 and HE22 instead of being the resistance of the heater element HE2. Moreover, the measured parallel resistance MPR of the channel 311 is calculated in a manner described above of calculating the measured parallel resistance MPR of the channel 310.

The host controller compares the measured parallel resistance MPR of the channel 311 with the ideal parallel resistance IPR of the channel 311. Upon determining that the measured parallel resistance MPR of the channel 311 is within the pre-determined threshold THRHOLD of the ideal parallel resistance IPR of the channel 311, the host controller determines that the heater elements of the channel 311 are operational. On the other hand, upon determining that the measured parallel resistance MPR of the channel 311 is not within the pre-determined threshold THRHOLD of the ideal parallel resistance IPR of the channel 311, the host controller determines that the heater element HE1, or the sub-heater element HE21, or the sub-heater element HE22, or the heater element HE3, or a connector between the heater element HE1 and the sub-heater element HE21, or a connector between the sub-heater element HE21 and the sub-heater element HE22, or a connector between the sub-heater element HE22 and the heater element HE3, or a connector between the path 216A (FIG. 2B) and the heater element HE1, or a connector coupled to the heater element HE3 to ground the heater element HE3, or a combination of two or more thereof, etc., is inoperational.

In one embodiment, the sub-heater element HE21 has a different resistance than that of the sub-heater element HE22. For example, a resistor of the sub-heater element HE21 is of a different length than a length of a resistor of the sub-heater element HE22 and/or a cross-sectional area of the resistor of the sub-heater element HE21 is different than a cross-sectional area of the resistor of the sub-heater element HE22.

Figures 2, 3C:
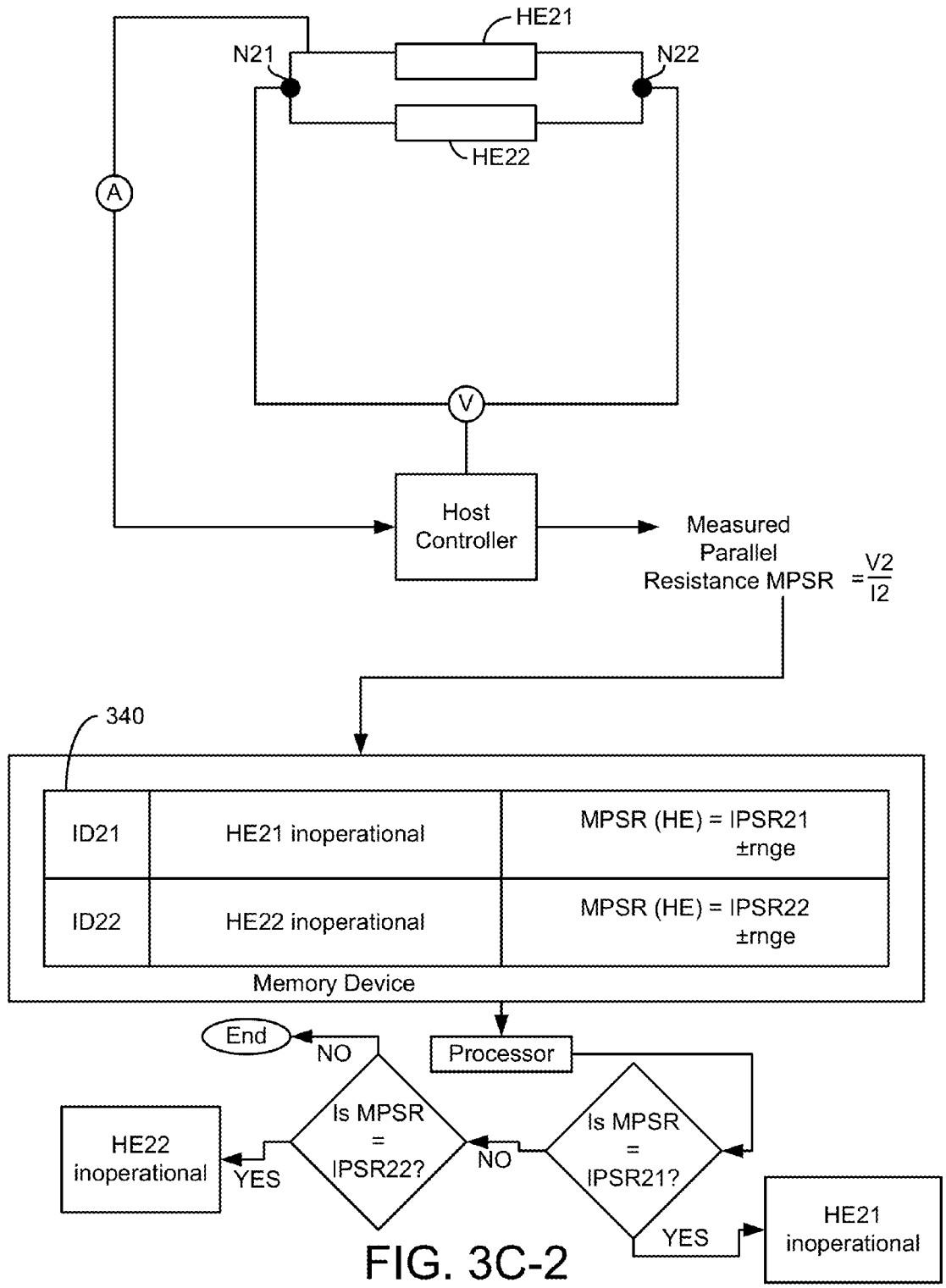

FIG. 3C-2 is a diagram to illustrate identification of the sub-heater element HE21 or the sub-heater element HE22 that is inoperational. The voltmeter V is connected by the user to a node N21 and a node N22 of a sub-channel that includes the sub-heater elements HE21 and HE22. Moreover, the ammeter A is connected to the node N21 of any of the sub-heater elements HE21 and HE22 by the user.

An ideal parallel resistance IPSR of the sub-heater elements HE21 and HE22 is calculated by the host controller. For example, the ideal parallel resistance IPSR is calculated as:

$$IPSR=1/\{(1/IR21)+(1/IR22)\} \quad (2),$$

where IR21 is an ideal resistance of the sub-heater element HE21 and IR22 is an ideal resistance of the sub-heater element HE22. The ideal resistances IR21 and IR22 are accessed by the host controller from a specification database, e.g., specification file, etc., which is stored in the memory device of the host controller or is accessed via the computer network by the host computer. As another example, when the gas heater channel 311 (FIG. 3C-1) is initially installed or serviced in a plasma system to heat one or more process gases, the voltmeter V measures a voltage between the nodes N21 and N22, and the ammeter A measures a current that passes through any of the sub-heater elements HE21 and HE22. For example, the ammeter A measures the current at the node N21 of any of the sub-heater elements HE21 and HE22. The current and the voltage measured is provided to the host controller, which calculates a commissioned resistance, e.g., the ideal parallel resistance IPSR, etc., from the current and the voltage. For example, the host controller calculates the commissioned resistance as a ratio of the voltage and current.

The ideal parallel resistance IPSR is calculated to be IPSR21 by the host controller when the ideal resistance IR21 is not applied in the equation (2) by the host controller. Similarly, the ideal parallel resistance IPSR is calculated to be IPSR22 when the ideal resistance IR22 is not applied in the equation (2) by the host controller. The ideal parallel resistances IPSR21 and IPSR22 are stored in a database 340 by the host controller. The database 340 is stored in the memory device of the host controller.

In one embodiment, the ideal parallel resistance IPSR21 is calculated when the voltmeter V is connected to the node N21 of the sub-heater element HE22 and not to the node N21 of the sub-heater element HE21, and is connected to the node N22 of the sub-heater element HE22 and not to the node N22 of the sub-heater element HE21, and the ammeter A is connected to the node N21 of the sub-heater element HE22 and not to the node N21 of the sub-heater element HE21. Moreover, the ideal parallel resistance IPSR22 is calculated when the voltmeter V is connected to the node N21 of the sub-heater element HE21 and not to the node N21 of the sub-heater element HE22, and is connected to the node N22 of the sub-heater element HE21 and not to the node N22 of the sub-heater element HE22, and the ammeter A is connected to the node N21 of the sub-heater element HE21 and not to the node N21 of the sub-heater element HE22.

During operation of the gas heater channel 311 in a plasma system, e.g., a period of time after the initial installation or service of the gas heater channel 311, a period of time after the gas heater channel 311 is used within the plasma system, after wear and tear of the gas heater channel 311, etc., the voltmeter V measures a voltage V2 across the nodes N21 and N22 of the sub-heater elements HE21 and HE22 and the ammeter A measures a current I2 at the node N21 of any of the sub-heater elements HE21 and HE22. The current I2 is a current that flows through any of the sub-heater elements HE21 and HE22. The current I2 is provided by the ammeter A to the host controller and the voltage V2 is provided by the voltmeter V to the host controller. The host controller calculates the measured parallel resistance MPSR as a ratio of the voltage V2 and the current I2.

The database 340 includes an identity of a sub-heater element that is inoperational and a value of the measured parallel resistance MPSR. For example, the database 340 includes a mapping between an identity ID21 of the sub-heater element HE21 and the value IPSR21 of the ideal parallel resistance IPSR. Moreover, the database 340 includes a mapping between an identity ID22 of the sub-heater element HE22 and a value IPSR22 of the ideal parallel resistance IPSR.

The host controller determines whether the measured parallel resistance MPSR has a value that is within a pre-determined range rnge, e.g., same as, within a pre-determined limit from, etc., of the value IPSR21. Upon determining that the measured parallel resistance MPSR has a value that is within the pre-determined range rnge of the value IPSR21, the host controller determines that the sub-heater element HE21 is inoperational and accesses the identity ID21 from the database 340 to indicate via the display device 122 (FIG. 1B) to the user that the sub-heater element HE21 is inoperational. It should be noted that when the identity ID21 is displayed, the sub-heater element HE21 and/or a connector coupled to the sub-heater element HE21 is inoperational.

On the other hand, upon determining that the measured parallel resistance MPSR has a value that is not within the pre-determined range rnge of the value IPSR21, the host controller determines whether the measured parallel resistance MPSR has a value that is within the pre-determined range rnge of the value IPSR22. Upon determining that the measured parallel resistance MPSR has a value that is within the pre-determined range rnge of the value IPSR22, the host controller determines that the sub-heater element HE22 is inoperational and accesses the identity ID22 from the database 340 for display via the display device 122 to the user. It should be noted that when the identity ID22 is displayed, the sub-heater element HE22 and/or a connector coupled to the sub-heater element HE22 is inoperational.

It should be noted that in an embodiment, an identity of a sub-heater element is provided to the user in the form of a sound via the audio equipment instead of or in addition to using the display device 122.

It should further be noted that when the voltmeter V is connected to the nodes N21 and N22, the sub-heater element HE21 is in series with the heater element HE22. The connection of the voltmeter V facilitates calculation of the measured parallel resistance MPSR. Similarly, when the ammeter A is connected to the node N21, the sub-heater element HE21 is in series with the sub-heater element HE22. The connection of the ammeter A facilitates calculation of the measured parallel resistance MPSR.

In one embodiment, an identity of a sub-heater element is transferred via the computer network to another host computer to display to the user and/or to provide to the user in the form of sound.

Figure 4:
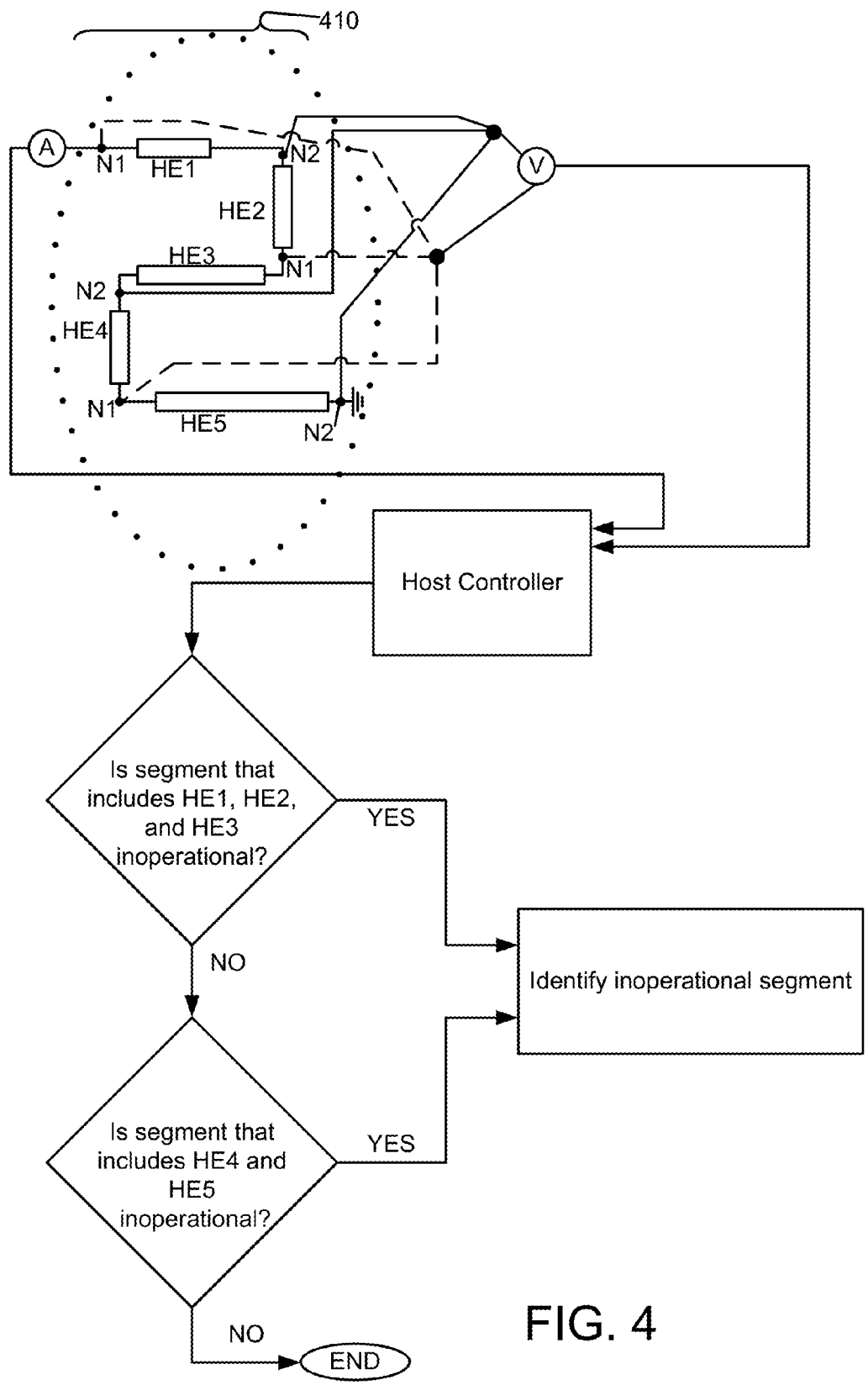
FIG. 4 is a diagram to illustrate that measurements of parameters from different heater elements within a gas heater channel are used to identify one or more heater elements of the gas heater channel that are inoperational.

FIG. 4 is a diagram to illustrate that measurements of parameters from different heater elements within a gas heater channel 410 are used to identify one or more heater elements of the gas heater channel 410 that are operational. The gas heater channel 410 includes the heater element HE1, the heater element HE2, the heater element HE3, a heater element HE4, and a heater element HE5. The heater element HE1 is connected in series with the heater element HE2, the heater element HE2 is connected in series with the heater element 3, the heater element 3 is connected in series with the heater element 4, and the heater element HE4 is connected in series with the heater element HE5. The heater element HE5 is grounded.

In one embodiment, the gas heater channel 410 includes any other number of heater elements, e.g., ten, twenty, in tens, in hundreds, etc.

The user connects the ammeter A to the node N1 of the heater element HE1 and connects the voltmeter V to the nodes N1 and N2 of the heater elements HE1, HE2, and HE3. As explained above with reference to FIGS. 3A and 3B, the host controller then determines whether a portion, e.g., a segment, etc., of the gas heater channel 410 that includes the heater elements HE1, HE2, and HE3 is operational. Upon determining that the portion of the gas heater channel 410 that includes the heater elements HE1, HE2, and HE3 is inoperational, the heater element HE1, or the heater element HE2, or the heater element HE3 is identified by the host controller.

On the other hand, upon determining that the portion that includes the heater elements HE1, HE2, and HE3 is operational, the user removes the connection of the voltmeter V from the nodes N1 and N2 of each of the heater elements HE1, HE2, and HE3. Also, the user removes the connection of the ammeter A from the node N1 of the heater element HE1. The user then connects the voltmeter V to the nodes N1 and N2 of the heater elements HE4 and HE5, and connects the ammeter A to the node N1 of the heater element HE4 or of HE5.

Then, in a manner similar to that explained above with reference to FIGS. 3A and 3B, the host controller then determines whether a portion, e.g., a segment, etc., of the gas heater channel 410 that includes the heater elements HE4 and HE5 is operational. Upon determining that the portion of the gas heater channel 410 that includes the heater elements HE4 and HE5 is inoperational, the heater element HE4 or the heater element HE5 is identified by the host controller.

Figure 5:
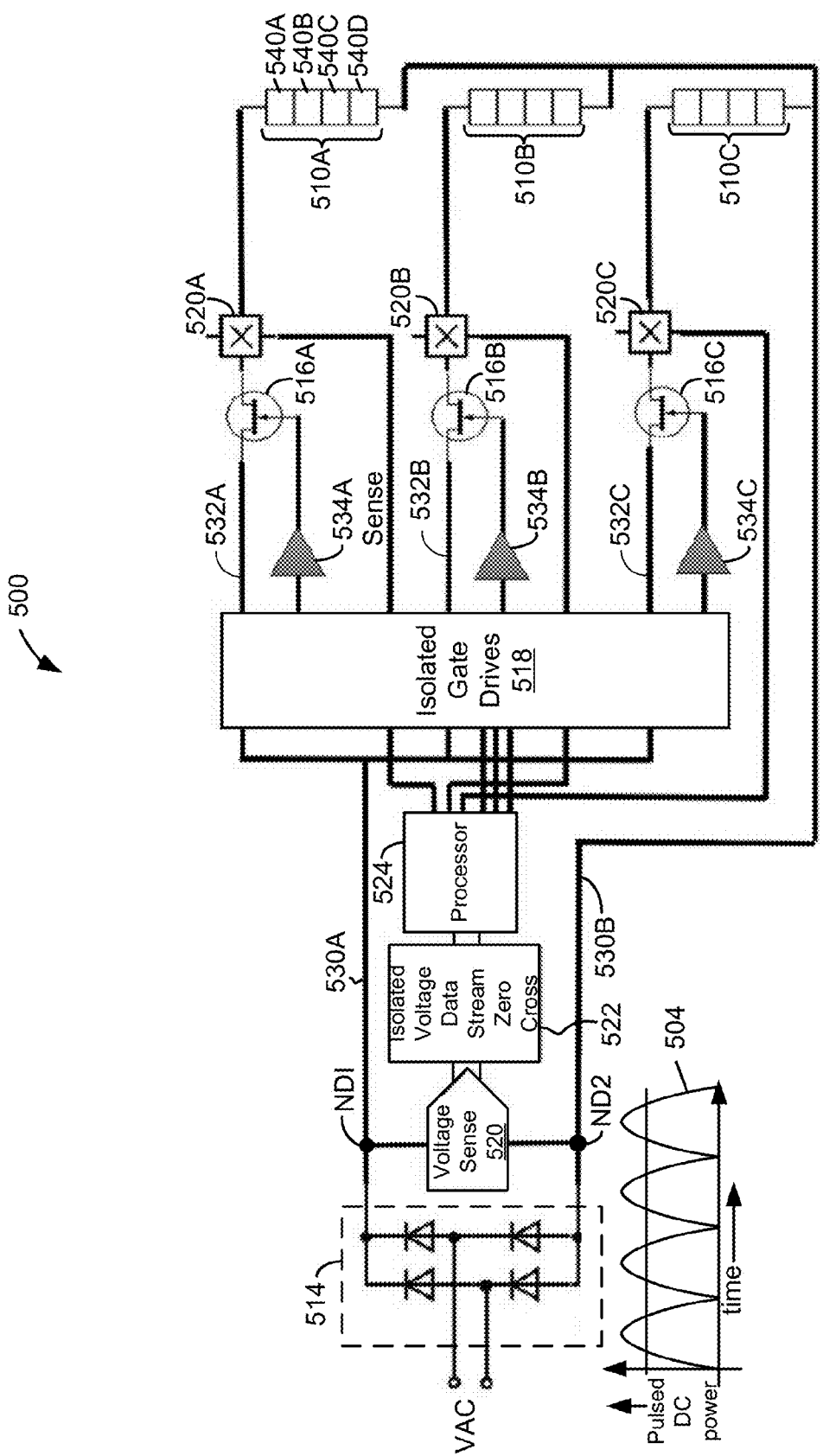
FIG. 5 is a diagram of an embodiment of a system for generating pulsed DC power and for identifying a heater element that is inoperational.

FIG. 5 is a diagram of an embodiment of a system 500 for generating pulsed DC power and for identifying a heater element that is inoperational. The system 500 includes a rectifier 514, a voltage sensor 520, a filter 522, a processor 524, gate drives 518, transistors 516A, 516B, and 516C, current sensors 520A, 520B, and 520C, and gas heater channels 510A, 510B, and 510C. An example of each of the gate drives 518 includes a transistor.

The rectifier 514 is an example of the rectifier 218 (FIG. 2B), the voltage sensor 520 is an example of the voltmeter V, and the processor 524 is an example of the processor of the host controller. Also, any of the current sensors 520A, 520B, and 520C is an example of the ammeter A. Moreover, the gas heater channel 510A is an example of the gas heater channel 110 or of the gas heater channel 112A or of the gas heater channel 112B or of the gas heater channel 112C or of the gas heater channel 112D. Also, the gas heater channel 510B is an example of the gas heater channel 110 or of the gas heater channel 112A or of the gas heater channel 112B or of the gas heater channel 112C or of the gas heater channel 112D. Moreover, the gas heater channel 510C is an example of the gas heater channel 110 or of the gas heater channel 112A or of the gas heater channel 112B or of the gas heater channel 112C or of the gas heater channel 112D.

The AC power source 212 (FIG. 2B) supplies AC power to the rectifier 514. The rectifier 514 rectifies, e.g., converts, etc., the AC power into a pulsed DC power 504. A first portion of the pulsed DC power 504 is supplied via an ND1 bus 530A and a bus 532A to the gas heater channel 510A, a second portion of the pulsed DC power 504 is supplied via the ND1 bus 530A and a bus 532B to the gas heater channel 510B, and a third portion of the pulsed DC power 504 is supplied via the ND1 bus and a bus 532C to the gas heater channel 510C.

It should be noted that the filter 522 filters the pulsed DC power to generate smooth pulsed DC power, which is provided to the processor 524. The processor 524 sends control signals to the gate drives 518. One of the gate drives 518 generates a power signal upon receiving one of the control signals and provides the power signal via a gate 534A to the transistor 516A. Similarly, another one of the gate drives 518 generates a power signal upon receiving another one of the control signals and provides the power signal via a gate 534B to the transistor 516B. Also, yet another one of the gate drives 518 generates a power signal upon receiving another one of the control signals and provides the power signal via a gate 534C to the transistor 516C.

Upon receiving the power signal via the gate 534A, the transistor 516A is activated and the transistor 516A transfers the portion of the pulsed DC power received via the bus 532A and the current sensor 520A to the gas heater channel 510A, which includes heater elements 540A, 540B, 540C, and 540D. The heater elements 540A, 540B, 540C, and 540D generate heat upon receiving the portion of the pulsed DC power 504 to heat one or more process gases within a gas line within the gas heater channel 510A.

Similarly, upon receiving the power signal via the gate 534B, the transistor 516B is turned on and transfers the portion of the pulsed DC power received via the bus 532B and the current sensor 520B to one or more heater elements of the gas heater channel 510B. The one or more heater elements of the gas heater channel 510B generate heat upon receiving the portion of the pulsed DC power 504 to heat one or more process gases within a gas line within the gas heater channel 510B.

Also, upon receiving the power signal via the gate 534C, the transistor 516C is turned on and transfers the portion of the pulsed DC power received via the bus 532C and the current sensor 520C to one or more heater elements of the gas heater channel 510C. The one or more heater elements of the gas heater channel 516C generate heat upon receiving the portion of the pulsed DC power 504 to heat one or more process gases within a gas line within the gas heater channel 510C.

The heater elements 540A, 540B, 540C, and 540C are connected in series with each other. For example, an output of the heater element 540A is connected to an input of the heater element 540B, an output of the heater element 540B is connected to an input of the heater element 540C, and an output of the heater element 540C is connected to an input of the heater element 540D.

It should be noted that although four heater elements are illustrated in the gas heater channel 510A, in an embodiment, the gas heater channel 510A includes any other number of heater elements.

The current sensor 520A measures an amount of current that passes via the transistor 516A to each of the heater elements 540A, 540B, 540C, and 540D of the gas heater channel 510A. Similarly, the current sensor 520B measures an amount of current that passes via the transistor 516B to the one or more heater elements of the gas heater channel 510B and the current sensor 520C measures an amount of current that passes via the transistor 516C to the one or more heater elements of the gas heater channel 510C.

Moreover, the voltage sensor 520 measures an amount of voltage between nodes ND1 and ND2 and the node ND2 is located on an ND2 bus 530B. The voltage is voltage between node ND1 and node ND2 of each of the heater elements 540A, 540B, 540C, and 540D.

By converting the AC power into the pulsed DC power 504, the voltage sensor 520 measures the voltage in a reliable manner and the current sensors 520A, 520B, and 520C measure the currents reliably. Moreover, the voltage measured for the gas heater channel 510A is sent from the voltage sensor 520 to the processor 524 and the current measured for the gas heater channel 510A is sent from the current sensor 520A to the processor 524. The voltage and current then are used by the processor 524 to identify one of the heater elements 540A, 540B, 540C, and 540D that is inoperational in a manner similar to that described above.

Figure 6:
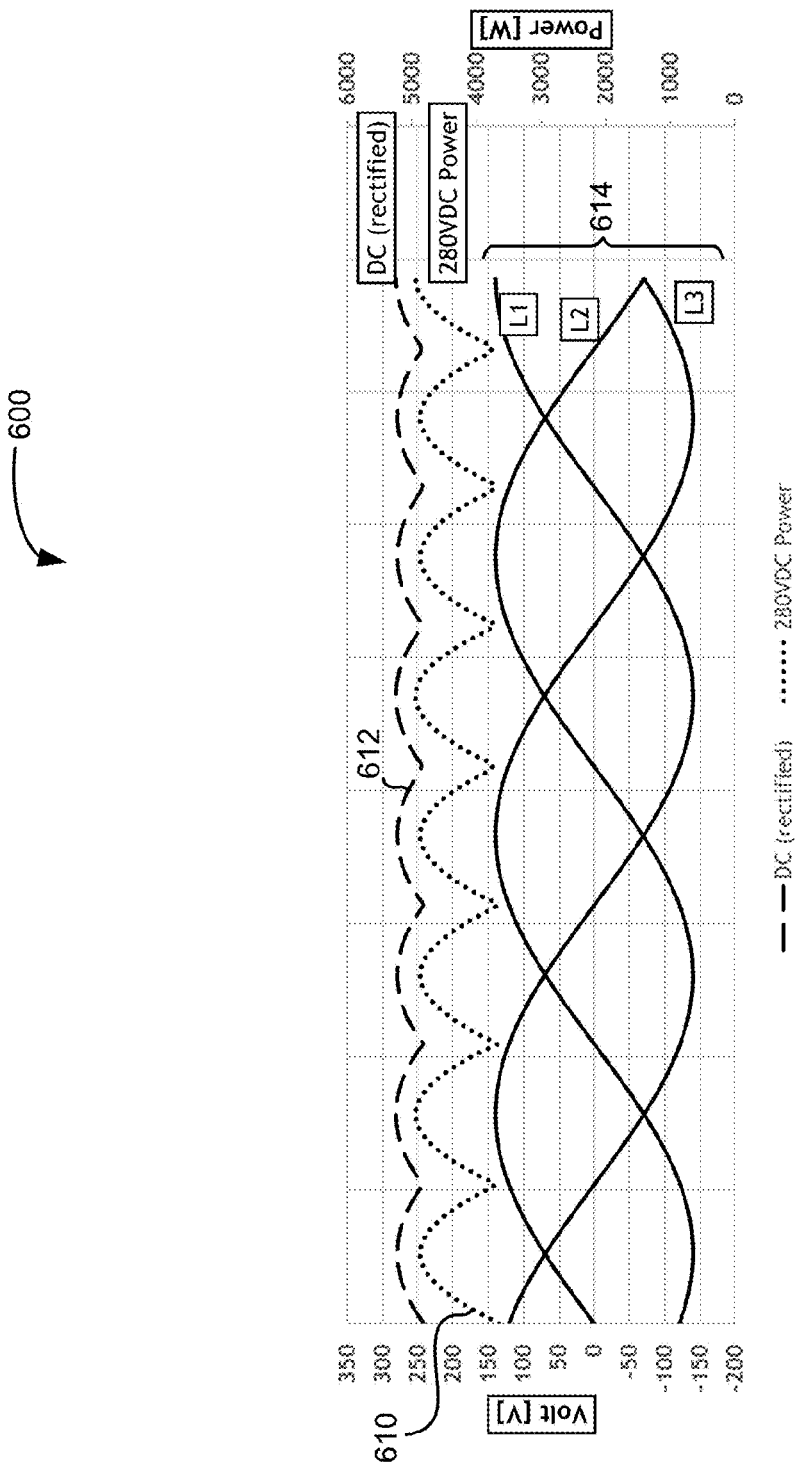
FIG. 6 shows embodiments of a graph to illustrate stability of pulsed DC power compared to alternating current (AC) power.

FIG. 6 shows embodiments of a graph 600 to illustrate stability of pulsed DC power compared to AC power. The graph 600 plots pulsed DC voltage 612, DC pulsed power 610, and 3-phase AC power 614 versus time t. The pulsed DC power 610 is generated from the pulsed DC voltage 612. The 3-phase AC power 614 is generated by the AC power source 212 (FIG. 2B). A rectifier generates the DC pulsed power 610 from the 3-phase AC power 614.

It should be noted that the 3-phase AC power 614 oscillates and becomes zero periodically. The oscillation and cycling through zero makes use of the 3-phase AC power 614 unstable and less reliable in measuring the parameters compared to use of the DC pulsed power 610 in measuring the parameters. The DC pulsed power 610 does not become zero and is more reliable than the 3-phase AC power 614. The user of DC pulsed power 610 provides continuous power delivery, e.g., at all instances of time, etc., to heater elements of a gas heater channel and the continuous power delivery makes the measurement of the parameters more reliable compared to intermittent power delivery of the 3-phase AC power 614. Moreover, the DC pulsed power 610 has smaller size energy packets than that of the 3-phase AC power 614 to reduce stress on a heater element to which the DC pulsed power 610 is provided. Moreover, the DC pulsed power 610 has an increased voltage compared to the 3-phase AC power 614. For the same amount of power, the increased voltage of the DC pulsed power 610 reduces average current passing through a heater element to which the DC pulsed power 610 is provided to decrease power lost by the heater element. Furthermore, use of the DC pulsed power 610 allows use of a firing order for energizing the heater channels 510A, 510B, and 510C (FIG. 5) to allow for precise energy management. Also, there is no need to use a snap action over temperature switch when the DC pulsed power 610 is supplied to the heater channels 510A, 510B, and 510C.

Figure 7:
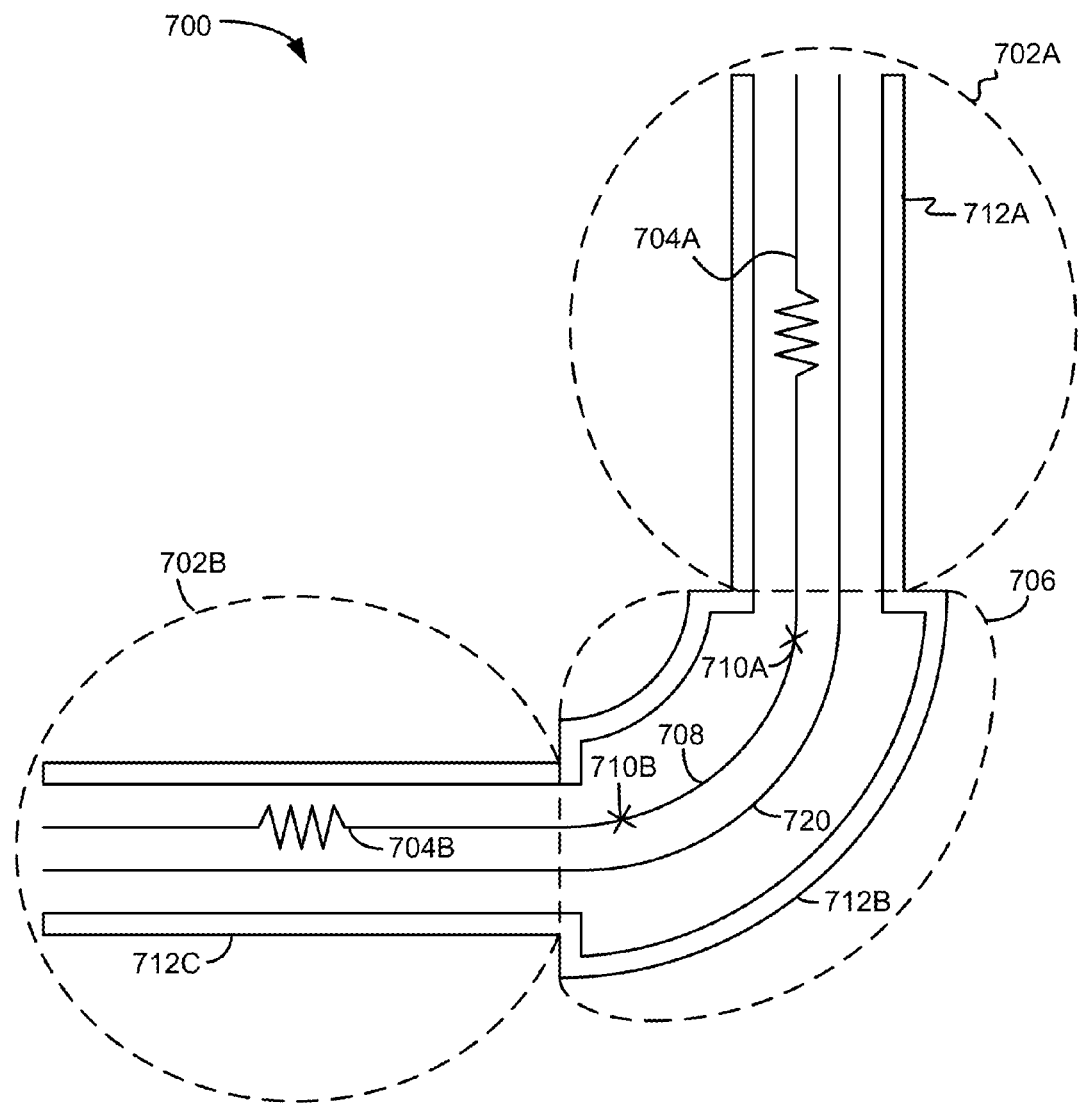
FIG. 7 is a diagram of an embodiment of a gas heater channel to illustrate a connection between heater elements of a gas heater channel.

FIG. 7 is a diagram of an embodiment of a gas heater channel 700 to illustrate a connection between heater elements 702A and 702B of a gas heater channel 700. The heater element 702A includes a resistor 704A and the heater element 702B includes a resistor 704B. The heater elements 702A and 702B are connected to each other via a connector 706. The connector 706 includes a connection medium 708, e.g., a wire, etc., that connects to the resistor 704A at a connection point 710A. Similarly, the connection medium 708 connects to the resistor 704B at a connection point 710B. The heater elements 702A and 702B generate heat that heats one or more process gases flowing through a gas line 720.

The heater element 702A includes a tube 712A that encloses and surrounds the resistor 704A. Similarly, the connector 706 includes a tube 712B that encloses and surrounds the connection medium 708. Also, the heater element 702B includes a tube 712C that encloses and surrounds the resistor 704C. The tube 712A fits with the tube 712B, which fits with the tube 712C.

In an embodiment, a tube is made of one or more metals, e.g., aluminum, steel, or a combination thereof, etc.

Figure 8:
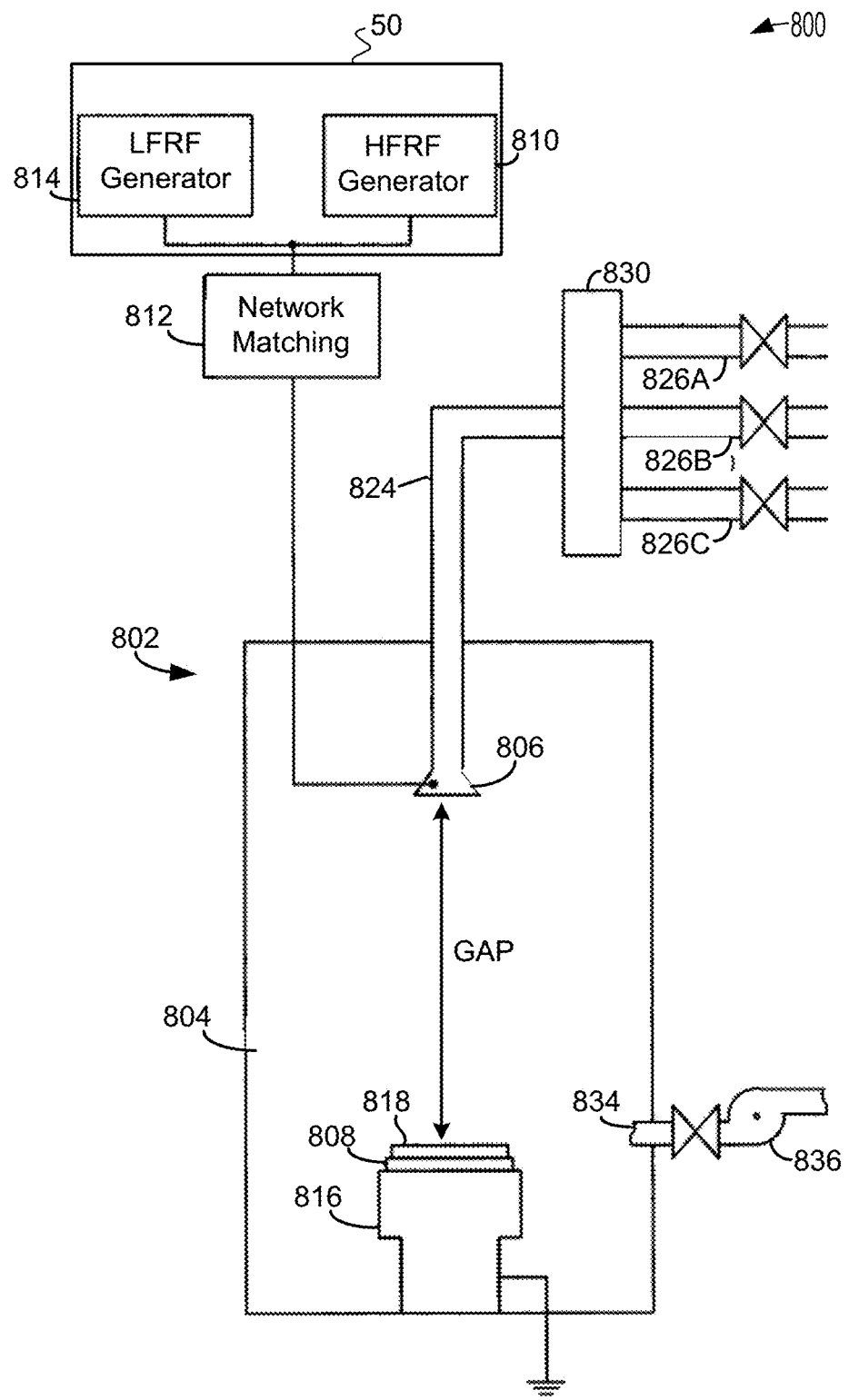
FIG. 8 shows a diagram of an embodiment of a chemical vapor deposition (CVD) system.

FIG. 8 shows an exemplary chemical vapor deposition (CVD) system 800. A deposition of film is implemented in a plasma enhanced chemical vapor deposition (PECVD) system. The PECVD system may take many different forms. The PECVD system includes one or more plasma chambers or "reactors" (sometimes including multiple stations) that house one or more wafers and are suitable for wafer processing. Each plasma chamber houses one or more wafers for processing. The one or more plasma chambers maintain a wafer in a defined position or positions (with or without motion within that position, e.g. rotation, vibration, or other agitation). A wafer undergoing deposition may be transferred from one station to another during the process. Of course, in one embodiment, the film deposition occurs entirely at a single station or any fraction of the film is deposited at any number of stations.

While in process, each wafer is held in place by a pedestal, wafer chuck and/or other wafer holding apparatus. For certain operations, the apparatus may include a heater such as a heating plate to heat the wafer. For example, a reactor 802 in FIG. 8 includes a process chamber 804, which encloses other components of the reactor and contains plasma. The plasma may be generated by a capacitor type system including a showerhead 806 working in conjunction with a grounded heater block 808. A high-frequency RF generator 810 and a low-frequency RF generator 814 are connected to the showerhead 806 via a matching network 812. The power and frequency supplied by the matching network 812 is sufficient to generate plasma from a process gas.

Within the reactor 802, a wafer pedestal 816 supports a substrate 818. The pedestal 816 typically includes a chuck, a fork, or lift pins to hold and transfer the substrate during and between the deposition and/or other plasma processes. Examples of the chuck include an electrostatic chuck and a mechanical chuck. One or more process gases are introduced via an inlet 824. Multiple source gas lines 826A, 826B, and 826C are connected to a manifold 830. One or more process gases are premixed or not. Appropriate valving and mass flow control mechanisms are employed to ensure that the correct process gases are delivered during a process.

Process gases exit the reactor 802 via an outlet 834. A vacuum pump 836 (e.g., a one or two stage mechanical dry pump and/or a turbomolecular pump) draws process gases out and maintains a suitably low pressure within the reactor by a close loop controlled flow restriction device, such as a throttle valve or a pendulum valve. It is possible to index wafers after every deposition and/or post-deposition plasma anneal treatment until all the required depositions and treatments are completed, or multiple depositions and treatments can be conducted at a single station before indexing the wafer.

In one embodiment, the inter-electrode gap is illustrated between the showerhead 806 (powered top electrode), and the pedestal 816 (e.g., grounded electrode) over which the wafer 818 is placed. As described in more detail below, bottom electrode or top electrode may be vertically adjusted to change the gap, so as to set or achieve a desired uniformity profile during deposition.

Figure 9:
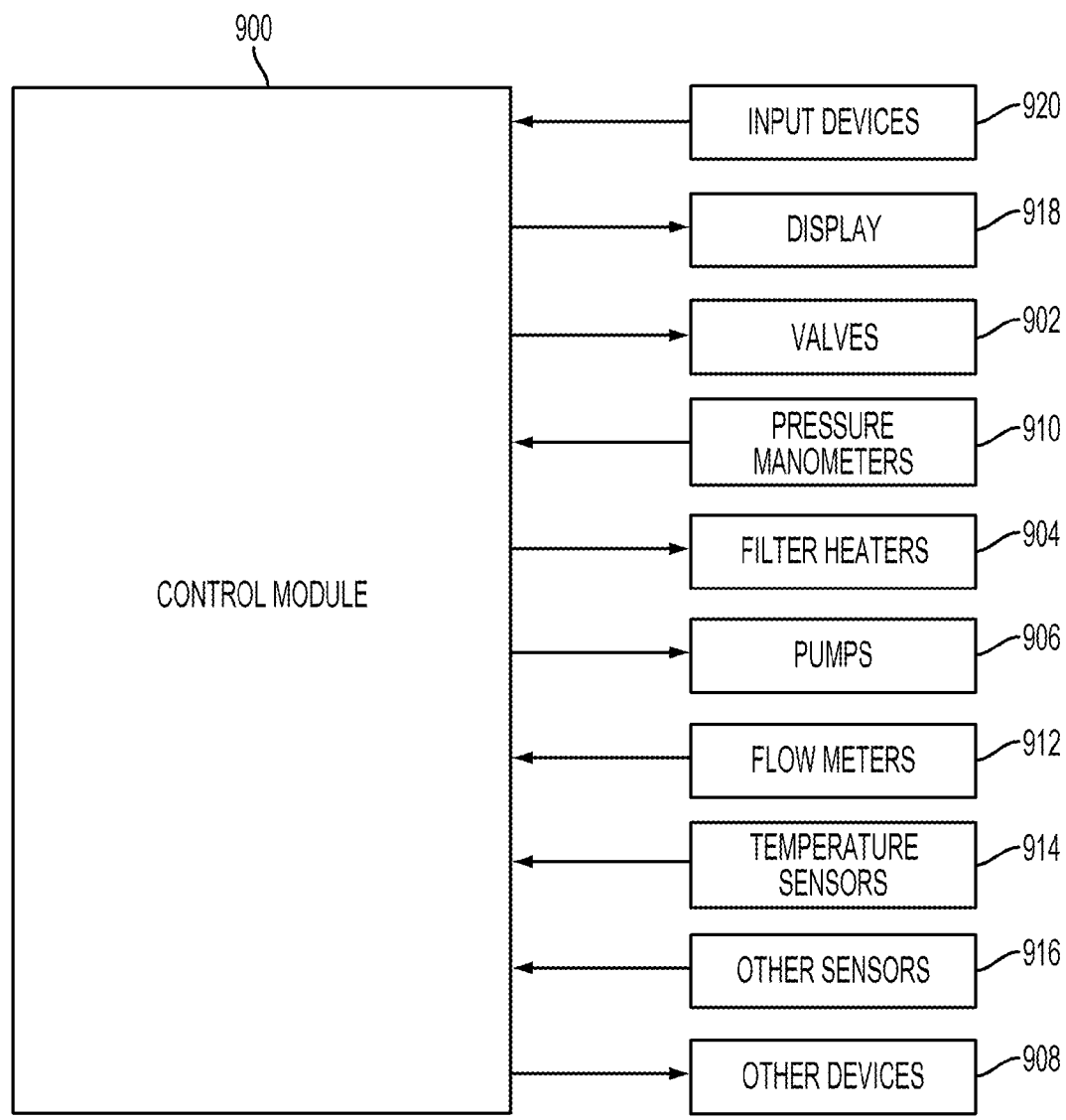
FIG. 9 is a diagram of an embodiment of a control module for controlling processes within a plasma chamber.

FIG. 9 shows a control module 900 for controlling processes within a plasma chamber described above. The control module 900 is an example of the host controller. In one embodiment, the control module 900 includes some example components. For instance, the control module 900 includes a processor, memory and one or more interfaces. The control module 900 is employed to control devices in the plasma system based in part on sensed values. For example, the control module 900 controls one or more of valves 902, filter heaters 904, pumps 906, and other devices 908 based on sensed values and other control parameters. The control module 900 receives the sensed values from, for example, pressure manometers 910, flow meters 912, temperature sensors 914, and/or other sensors 916. The control module 900 is be employed to control process conditions, e.g., during precursor delivery and deposition of a film, etc. In one embodiment, the control module 900 will typically include one or more memory devices and one or more processors.

The control module 900 controls activities associated with implementing the process conditions. For example, the control module 900 executes computer programs including sets of instructions for controlling process timing, delivery system temperature, pressure differentials across the filters, valve positions, mixture of gases, chamber pressure, chamber temperature, wafer temperature, RF power levels, wafer chuck or pedestal position, and other parameters of a particular process.

Typically, there will be a user interface associated with the control module 900. The user interface includes a display 918 (e.g. a display screen and/or graphical software displays of the apparatus and/or process conditions), and user input devices 920 such as pointing devices, keyboards, touch screens, microphones, etc. The display 918 is an example of the display device 122 (FIG. 1B).

A computer program for controlling implementing of the process conditions can be written in any conventional computer readable programming language: for example, assembly language, C, C++, Pascal, Fortran or others. Compiled object code or script is executed by the processor to perform the tasks identified in the computer program.

The control module parameters relate to the process conditions such as, for example, filter pressure differentials, process gas composition and flow rates, temperature, pressure, plasma conditions such as RF power levels and the low frequency RF frequency, cooling gas pressure, and chamber wall temperature.

The computer program is designed or configured in many different ways. For example, various chamber component subroutines or control objects are written to control operation of components of the plasma chamber 124 (FIG. 1B) to carry out the process conditions. Examples of programs or sections of programs for this purpose include substrate positioning code, process gas control code, pressure control code, heater control code, and plasma control code.

A substrate positioning program includes a program code for controlling chamber components that are used to load a substrate onto a pedestal or chuck and to control spacing between the substrate and other parts of the plasma chamber 124 such as a gas inlet and/or target. A process gas control program includes a program code for controlling gas composition and flow rates and optionally for flowing gas into the plasma chamber 124 prior to deposition in order to stabilize the pressure in the plasma chamber 124. A filter monitoring program includes a program code that compares measured differential(s) to predetermined value(s) and/or code for switching paths. A pressure control program includes a program code for controlling pressure in the plasma chamber 124 by regulating, e.g., a throttle valve in an exhaust system of the plasma chamber 124. A heater control program includes a program code for controlling a current to heater elements for heating one or more process gases in a gas line, for heating the substrate, and/or other portions of the system. For example, the heater control program controls delivery of a heat transfer gas, such as, e.g., helium, etc., to the wafer chuck.

Examples of sensors that may be monitored during a process include, but are not limited to, mass flow control modules, pressure sensors such as the pressure manometers 910, and thermocouples located in delivery system, the pedestal or chuck (e.g. the temperature sensors 914). Appropriately programmed feedback and control algorithms are used with data from these sensors to maintain desired process conditions. The foregoing describes implementation of embodiments of the invention in a single or multi-chamber semiconductor processing tool.

In one embodiment, functions described herein as being performed by a controller are performed by a processor of the controller.

In an embodiment, functions described herein as being performed by a controller are performed by multiple controllers, e.g., are distributed between multiple controllers.

Embodiments, described herein, may be practiced with various computer system configurations including hand-held hardware units, microprocessor systems, microprocessor-based or programmable consumer electronics, minicomputers, mainframe computers and the like. The embodiments, described herein, can also be practiced in distributed computing environments where tasks are performed by remote processing hardware units that are linked through a computer network.

In some embodiments, a controller is part of a system, which may be part of the above-described examples. The system includes semiconductor processing equipment, including a processing tool or tools, chamber or chambers, a platform or platforms for processing, and/or specific processing components (a wafer pedestal, a gas flow system, etc.). The system is integrated with electronics for controlling its operation before, during, and after processing of a semiconductor wafer or substrate. The electronics is referred to as the "controller," which may control various components or subparts of the system. The controller, depending on processing requirements and/or a type of the system, is programmed to control any process disclosed herein, including a delivery of process gases, temperature settings (e.g., heating and/or cooling), pressure settings, vacuum settings, power settings, RF generator settings, RF matching circuit settings, frequency settings, flow rate settings, fluid delivery settings, positional and operation settings, wafer transfers into and out of a tool and other transfer tools and/or load locks connected to or interfaced with the system.

Broadly speaking, in a variety of embodiments, the controller is defined as electronics having various integrated circuits, logic, memory, and/or software that receive instructions, issue instructions, control operation, enable cleaning operations, enable endpoint measurements, and the like. The integrated circuits include chips in the form of firmware that store program instructions, digital DSPs, chips defined as ASICs, PLDs, one or more microprocessors, or microcontrollers that execute program instructions (e.g., software). The program instructions are instructions communicated to the controller in the form of various individual settings (or program files), defining operational parameters for carrying out a process on or for a semiconductor wafer. The operational parameters are, in some embodiments, a part of a recipe defined by process engineers to accomplish one or more processing steps during the fabrication of one or more layers, materials, metals, oxides, silicon, silicon dioxide, surfaces, circuits, and/or dies of a wafer.

The controller, in some embodiments, is a part of or coupled to a computer that is integrated with, coupled to the system, otherwise networked to the system, or a combination thereof. For example, the controller is in a "cloud" or all or a part of a fab host computer system, which allows for remote access for wafer processing. The controller enables remote access to the system to monitor current progress of fabrication operations, examines a history of past fabrication operations, examines trends or performance metrics from a plurality of fabrication operations, to change parameters of current processing, to set processing steps to follow a current processing, or to start a new process.

In some embodiments, a remote computer (e.g. a server) provides process recipes to the system over a computer network, which includes a local network or the Internet. The remote computer includes a user interface that enables entry or programming of parameters and/or settings, which are then communicated to the system from the remote computer. In some examples, the controller receives instructions in the form of settings for processing a wafer. It should be understood that the settings are specific to a type of process to be performed on a wafer and a type of tool that the controller interfaces with or controls. Thus as described above, the controller is distributed, such as by including one or more discrete controllers that are networked together and working towards a common purpose, such as the fulfilling processes described herein. An example of a distributed controller for such purposes includes one or more integrated circuits on a chamber in communication with one or more integrated circuits located remotely (such as at a platform level or as part of a remote computer) that combine to control a process in a chamber.

Without limitation, in various embodiments, the system includes a plasma etch chamber, a deposition chamber, a spin-rinse chamber, a metal plating chamber, a clean chamber, a bevel edge etch chamber, a physical vapor deposition (PVD) chamber, a CVD chamber, an atomic layer deposition (ALD) chamber, an atomic layer etch (ALE) chamber, an ion implantation chamber, a track chamber, and any other semiconductor processing chamber that is associated or used in fabrication and/or manufacturing of semiconductor wafers.

It is further noted that although the above-described operations are described with reference to a parallel plate plasma chamber, e.g., a capacitively coupled plasma chamber, etc., in some embodiments, the above-described operations apply to other types of plasma chambers, e.g., a plasma chamber including an inductively coupled plasma (ICP) reactor, a transformer coupled plasma (TCP) reactor, conductor tools, dielectric tools, a plasma chamber including an electron cyclotron resonance (ECR) reactor, etc. For example, the x MHz RF generator, the y MHz RF generator, and the z MHz RF generator are coupled via an impedance matching network to an inductor within the ICP plasma chamber.

As noted above, depending on a process operation to be performed by the tool, the controller communicates with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

With the above embodiments in mind, it should be understood that some of the embodiments employ various computer-implemented operations involving data stored in computer systems. These computer-implemented operations are those that manipulate physic al quantities.

Some of the embodiments also relate to a hardware unit or an apparatus for performing these operations. The apparatus is specially constructed for a special purpose computer. When defined as a special purpose computer, the computer performs other processing, program execution or routines that are not part of the special purpose, while still being capable of operating for the special purpose.

In some embodiments, the operations, described herein, are performed by a computer selectively activated, or are configured by one or more computer programs stored in a computer memory, or are obtained over a computer network. When data is obtained over the computer network, the data may be processed by other computers on the computer network, e.g., a cloud of computing resources.

One or more embodiments, described herein, can also be fabricated as computer-readable code on a non-transitory computer-readable medium. The non-transitory computer-readable medium is any data storage hardware unit, e.g., a memory device, etc., that stores data, which is thereafter read by a computer system. Examples of the non-transitory computer-readable medium include hard drives, network attached storage (NAS), ROM, RAM, compact disc-ROMs (CD-ROMs), CD-recordables (CD-Rs), CD-rewritables (CD-RWs), magnetic tapes and other optical and non-optical data storage hardware units. In some embodiments, the non-transitory computer-readable medium includes a computer-readable tangible medium distributed over a network-coupled computer system so that the computer-readable code is stored and executed in a distributed fashion.

Although some method operations, described above, were presented in a specific order, it should be understood that in various embodiments, other housekeeping operations are performed in between the method operations, or the method operations are adjusted so that they occur at slightly different times, or are distributed in a system which allows the occurrence of the method operations at various intervals, or are performed in a different order than that described above.

It should further be noted that in an embodiment, one or more features from any embodiment described above are combined with one or more features of any other embodiment without departing from a scope described in various embodiments described in the present disclosure.

Although the foregoing embodiments have been described in some detail for purposes of clarity of understanding, it will be apparent that certain changes and modifications can be practiced within the scope of appended claims. Accordingly, the present embodiments are to be considered as illustrative and not restrictive, and the embodiments are not to be limited to the details given herein, but may be modified within the scope and equivalents of the appended claims.

The invention claimed is:

1. A method for determining a fault in a gas heater channel, comprising:
   receiving from one or more sensors measured parameters associated with a plurality of heater elements of the gas heater channel, wherein the plurality of heater elements are coupled in series to form a plurality of series-coupled heater elements, wherein a first one of the plurality of series-coupled heater elements is coupled via a connector to a second one of the plurality of series-coupled heater elements, wherein the gas heater channel is configured to transfer one or more gases from a gas supply to a plasma chamber;
   calculating a measured parallel resistance of the plurality of series-coupled heater elements from the measured parameters;
   comparing the measured parallel resistance to an ideal parallel resistance of the plurality of series-coupled heater elements of the gas heater channel;
   determining based on the comparison that a portion of the gas heater channel is inoperational, wherein the portion of the gas heater channel includes the first one of the plurality of the series-coupled heater elements; and
   selecting an identity of the first one of the plurality of series-coupled heater elements from a correspondence between a plurality of identities of the plurality of series-coupled heater elements and the measured parallel resistance, wherein the selection of the identity facilitates identification of the first one of the plurality of series-coupled heater elements having the fault.

2. The method of claim 1, further comprising providing the identity of the first one of the plurality of series-coupled heater elements for display on a display screen.

3. The method of claim 1, further comprising:
   receiving alternating current (AC) power from an AC power source;
   converting the AC power into pulsed direct current (DC) power; and
   providing the pulsed DC power to the plurality of series-coupled heater elements of the gas heater channel for heating a gas supply line and for measuring the parameters using the one or more sensors.

4. The method of claim 3, wherein the gas supply line is coupled to a plurality of gas supply lines for transferring the one or more gases to the plasma chamber and additional plasma chambers.

5. The method of claim 1, wherein the one or more sensors include a plurality of sensors, wherein the plurality of sensors includes a voltage sensor and a current sensor.

6. The method of claim 1, further comprising receiving parameters from the one or more sensors to calculate the ideal parallel resistance, wherein the ideal parallel resistance is calculated before the measured parallel resistance is calculated.

7. The method of claim 1, further comprising determining based on the comparison that the measured parallel resistance is not within a pre-determined threshold of the ideal parallel resistance, wherein determining that the portion of the gas heater channel is inoperational is performed upon determining that the measured parallel resistance is not within the pre-determined threshold of the ideal parallel resistance.

8. The method of claim 1, further comprising:
determining whether the measured parallel resistance is within a threshold of a first value of the ideal parallel resistance or within the threshold of a second value of the ideal parallel resistance, wherein the first value is obtained for the first one of the plurality of series-coupled heater elements and the second value of the ideal parallel resistance is obtained for the second one of the plurality of series-coupled heater elements,
wherein selecting the identity is performed upon determining that the measured parallel resistance is within the threshold of the first value of the ideal parallel resistance,
selecting another one of the plurality of identities of the second one of the plurality of series-coupled heater elements upon determining that the measured parallel resistance is within the threshold of the second value of the ideal parallel resistance.

9. The method of claim 1, wherein the first one of the plurality of series-coupled heater elements includes a plurality of sub-heater elements, the method further comprising:
receiving from the one or more sensors a plurality of measured parameters of the sub-heater elements after selecting the identity of the first one of the plurality of series-coupled heater elements;
calculating a measured parallel sub-resistance of the plurality of sub-heater elements from the measured parameters of the plurality of sub-heater elements;
determining whether the measured parallel sub-resistance is within a range from a first value of an ideal parallel sub-resistance or within the range from a second value of the ideal parallel sub-resistance, wherein the first value of the ideal parallel sub-resistance is obtained for one of the plurality of sub-heater elements and the second value of the ideal parallel sub-resistance is obtained for another one of the plurality of sub-heater elements; and
selecting an identity of the one of the plurality of sub-heater elements from a correspondence between a plurality of identities of the sub-heater elements and the measured parallel sub-resistance, wherein the selection of the identity of the one of the sub-heater elements facilitates identification of a sub-portion of the gas heater channel having the fault.

10. The method of claim 9,
wherein selecting the identity of the one of the sub-heater elements is performed upon determining that the measured parallel sub-resistance is within the range from the first value of the ideal parallel sub-resistance,
selecting another one of the plurality of identities of the other one of the sub-heater elements upon determining that the measured parallel sub-resistance is within the range from the second value of the ideal parallel sub-resistance.

11. The method of claim 1, wherein the portion includes the connector between the first one of the series-coupled heater elements and the second one of the plurality of series-coupled heater elements, or a connection medium between the first one of the plurality of series-coupled heater elements and a third one of the plurality of series-coupled heater elements, or a combination thereof.

12. The method of claim 1, wherein each of the plurality of series-coupled heater elements has a first node and a second node, wherein the parameters are measured by connecting a current sensor to the first node of the first one of the plurality of series-coupled heater elements and by connecting a voltage sensor to the first and second nodes of the plurality of series-coupled heater elements.

13. The method of claim 1, wherein each of the plurality of series-coupled heater elements includes a resistor, wherein the gas heater channel includes a gas pipe configured to supply the one or more gases to the plasma chamber for processing a wafer within the plasma chamber.

14. The method of claim 1, wherein the gas supply includes a gas source configured to store the one or more gases.

15. The method of claim 1, wherein the plasma chamber is configured to couple to an impedance matching circuit, wherein the impedance matching circuit is configured to couple to one or more radio frequency (RF) generators for receiving one or more RF signals from the corresponding one or more RF generators.

16. A method for determining a fault in a gas heater channel, comprising:
receiving from one or more sensors measured parameters associated with a first plurality of heater elements of the gas heater channel, wherein the gas heater channel is configured to transfer one or more gases from a gas supply to a plasma chamber;
calculating a measured parallel resistance of the first plurality of heater elements from the measured parameters associated with the first plurality of heater elements;
comparing the measured parallel resistance of the first plurality of heater elements to an ideal parallel resistance of the first plurality of heater elements of the gas heater channel;
determining based on the comparison that the first plurality of heater elements is operational;
receiving from the one or more sensors measured parameters associated with a second plurality of heater elements of the gas heater channel, wherein the second plurality of heater elements are coupled in series to form a plurality of series-coupled heater elements, wherein a first one of the plurality of series-coupled heater elements is coupled via a connector to a second one of the plurality of series-coupled heater elements;
calculating a measured parallel resistance of the plurality of series-coupled heater elements from the measured parameters associated with the plurality of series-coupled heater elements;
comparing the measured parallel resistance of the plurality of series-coupled heater elements to an ideal parallel resistance of the plurality of series-coupled heater elements of the gas heater channel;
determining based on the comparison that the plurality of series-coupled heater elements is inoperational; and
selecting an identity of one of the heater elements of the plurality of series-coupled heater elements from a correspondence between a plurality of identities and the measured parallel resistance of the plurality of series-coupled heater elements, wherein the selection of the identity facilitates identification of a portion of the gas heater channel having the fault.

17. The method of claim 16, wherein one of the heater elements of the first plurality of heater elements is configured to connect to another one of the heater elements of the first plurality of heater elements.

18. The method of claim 16, further comprising:
determining whether the measured parallel resistance of the plurality of series-coupled heater elements is within a threshold of a first value of the ideal parallel resistance of the plurality of series-coupled heater elements or within the threshold of a second value of the ideal parallel resistance of the plurality of series-coupled heater elements, wherein the first value of the ideal parallel resistance of the plurality of series-coupled heater elements is obtained for the one of the heater elements of the plurality of series-coupled heater elements and the second value of the ideal parallel resistance is obtained for another one of the heater elements of the plurality of series-coupled heater elements, wherein selecting the identity is performed upon determining that the measured parallel resistance of the plurality of series-coupled heater elements is within the threshold of the first value of the ideal parallel resistance of the plurality of series-coupled heater elements, selecting another one of the plurality of identities of the other one of the heater elements of the plurality of series-coupled heater elements upon determining that the measured parallel resistance of the plurality of series-coupled heater elements is within the threshold of the second value of the ideal parallel resistance of the plurality of series-coupled heater elements.

19. A system for determining a fault in a gas heater channel, comprising:
- an alternating current (AC) source configured to generate AC power;
- a rectifier coupled to the AC source and configured to convert the AC power into pulsing direct current (DC) power;
- a transistor;
- a gate drive coupled to the rectifier and to the transistor and configured to drive the transistor;
- a channel of heater elements, wherein the heater elements are coupled in series to form a plurality of series-coupled heater elements, wherein a first one of the plurality of series-coupled heater elements is coupled via a connector to a second one of the plurality of series-coupled heater elements;
- a current sensor coupled to the transistor and to the plurality of series-coupled heater elements and configured to sense a current provided to the plurality of series-coupled heater elements, wherein the current is provided when the transistor is driven,
- wherein each of the plurality of series-coupled heater elements has a first node and a second node;
- a voltage sensor coupled to the first node of the plurality of series-coupled heater elements and the second node of the plurality of series-coupled heater elements and configured to measure voltage across each of the plurality of series-coupled heater elements;
- a processor coupled to the voltage sensor and the current sensor, the processor configured to:
  - receive the voltage measured by the voltage sensor and the current sensed by the current sensor;
  - calculate a parallel resistance of the plurality of series-coupled heater elements from the voltage and the current;
  - determine whether the calculated parallel resistance is within a pre-determined threshold of an ideal parallel resistance of the plurality of series-coupled heater elements;
  - determine that a portion of the channel is inoperational upon determining that the calculated parallel resistance is not within the pre-determined threshold of the ideal parallel resistance; and
  - select an identity of the first one of the plurality of series-coupled heater elements from a correspondence between a plurality of identities and the calculated parallel resistance, wherein the selection of the identity facilitates identification of the portion of the channel having the fault.

20. The system of claim 19, wherein the processor is further configured to:
- determine whether the calculated parallel resistance is within a threshold of a first value of the ideal parallel resistance or within the threshold of a second value of the ideal parallel resistance, wherein the first value is obtained when the first one of the plurality of series-coupled heater elements is inoperational and the second value of the ideal parallel resistance is obtained when the second one of the plurality of series-coupled heater elements is inoperational,
- wherein the processor is configured to select the identity is performed upon determining that the calculated parallel resistance is within the threshold of the first value of the ideal parallel resistance,
- wherein the processor is configured to select another one of the plurality of identities of the second one of the plurality of series-coupled heater elements upon determining that the calculated parallel resistance is within the threshold of the second value of the ideal parallel resistance.

* * * * *